US011935598B2

(12) United States Patent
Okuyama

(10) Patent No.: US 11,935,598 B2
(45) Date of Patent: Mar. 19, 2024

(54) SEMICONDUCTOR STORAGE DEVICE AND METHODS FOR WRITING THE SAME

(71) Applicant: Kioxia Corporation, Tokyo (JP)

(72) Inventor: Kiyoshi Okuyama, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 141 days.

(21) Appl. No.: 17/685,873

(22) Filed: Mar. 3, 2022

(65) Prior Publication Data
US 2023/0091024 A1 Mar. 23, 2023

(30) Foreign Application Priority Data

Sep. 21, 2021 (JP) ................. 2021-153609

(51) Int. Cl.
*G11C 16/04* (2006.01)
*G11C 16/10* (2006.01)
*G11C 16/32* (2006.01)

(52) U.S. Cl.
CPC .............. *G11C 16/10* (2013.01); *G11C 16/32* (2013.01)

(58) Field of Classification Search
CPC ...... G11C 16/10; G11C 16/32; G11C 16/0483
USPC .................................................. 365/185.18
See application file for complete search history.

(56) References Cited

U.S. PATENT DOCUMENTS

| 8,400,832 | B2* | 3/2013 | Endo | ......................... | G11C 5/06 |
| | | | | | 257/314 |
| 9,153,327 | B2* | 10/2015 | Ching | ................ | G11C 16/0441 |
| 9,318,208 | B1* | 4/2016 | Lin | ........................ | G11C 16/14 |
| 2010/0193861 | A1 | 8/2010 | Shim et al. | | |
| 2015/0187782 | A1* | 7/2015 | Yamakoshi | ........ | G11C 16/0441 |
| | | | | | 257/321 |
| 2017/0117047 | A1 | 4/2017 | Maejima | | |
| 2017/0256316 | A1 | 9/2017 | Maejima | | |
| 2020/0090772 | A1 | 3/2020 | Maeda | | |

FOREIGN PATENT DOCUMENTS

| CN | 101794789 A | 8/2010 |
| JP | 2017-157260 A | 9/2017 |
| TW | 201830401 A | 8/2018 |

* cited by examiner

*Primary Examiner* — Tha-O H Bui
(74) *Attorney, Agent, or Firm* — Foley & Lardner LLP

(57) ABSTRACT

A semiconductor storage device is provided. The semiconductor storage device includes a first voltage supply line coupled to a gate electrode of a first memory transistor through a first transistor, a first signal supply line coupled to a gate electrode of the first transistor, a first capacitor coupled to the gate electrode of the first memory transistor, and a first wiring coupled between the gate electrode of the first memory transistor and the first transistor through the first capacitor. In a write operation on the first memory transistor, at a second timing after a first timing, a voltage present on the first signal supply line decreases from a second voltage to a fourth voltage lower than the second voltage, and at a third timing after the second timing, the voltage present on the first wiring increases from a third voltage to a fifth voltage higher than the third voltage.

15 Claims, 21 Drawing Sheets

SEMICONDUCTOR STORAGE DEVICE AND METHODS FOR WRITING THE SAME

CROSS-REFERENCE TO RELATED APPLICATION

This application is based upon and claims the benefit of priority from Japanese Patent Application No. 2021-153609, filed Sep. 21, 2021, the entire contents of which are incorporated herein by reference.

FIELD

Embodiments described herein relate generally to a semiconductor storage device and a control method of the semiconductor storage device.

BACKGROUND

A semiconductor storage device generally includes a plurality of memory transistors.

DETAILED DESCRIPTION

Figure 1:
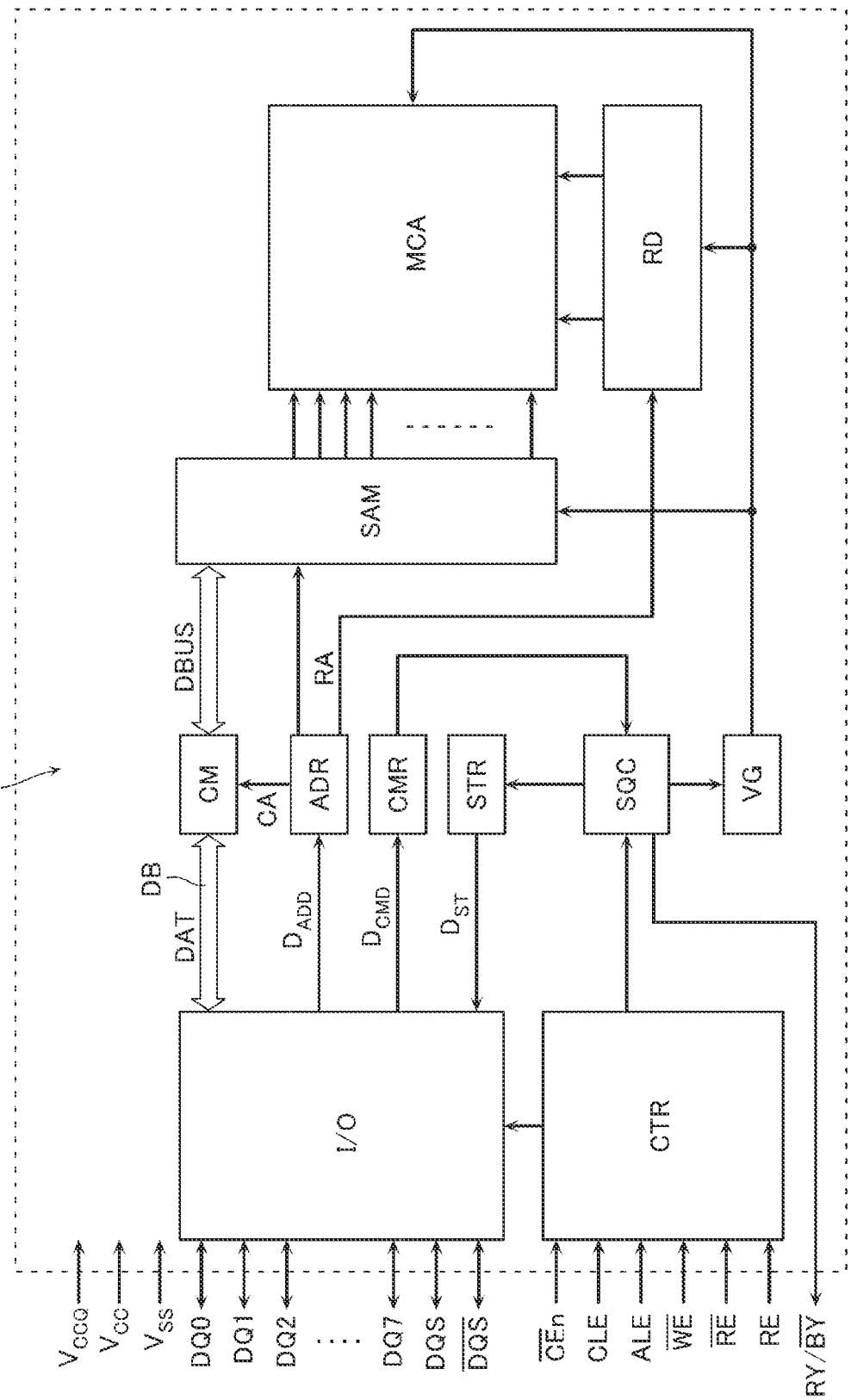
FIG. 1 is a schematic block diagram illustrating a configuration of a semiconductor storage device according to a first embodiment.

Embodiments provide a semiconductor storage device having a long lifetime.

In general, according to one embodiment, a semiconductor storage device includes: a first memory transistor; a first transistor electrically coupled to a gate electrode of the first memory transistor; a first voltage supply line electrically coupled to the gate electrode of the first memory transistor through the first transistor; a first signal supply line electrically coupled to a gate electrode of the first transistor; a first capacitor electrically coupled to the gate electrode of the first memory transistor without passing through the first transistor; and a first wiring coupled to a current path between the gate electrode of the first memory transistor and the first transistor through the first capacitor. In a write operation on the first memory transistor, at a first timing, a voltage present on the first voltage supply line is a first voltage, a voltage present on the first signal supply line is a second voltage, and a voltage present on the first wiring is a third voltage. At a second timing after the first timing, the voltage present on the first signal supply line decreases from the second voltage to a fourth voltage lower than the second voltage. At a third timing after the second timing, the voltage present on the first wiring increases from the third voltage to a fifth voltage higher than the third voltage.

Then, a semiconductor storage device according to embodiments will be described in detail with reference to the drawings. The following embodiments are merely examples, and are not intended to limit the present disclosure. The following drawings are schematic, and some configurations and the like may be omitted for the sake of convenience in description. Common portions in a plurality of embodiments are denoted by the same reference signs, and repetitive description thereof may be omitted.

The term "semiconductor storage device" used in the present specification may mean a memory die, or mean a memory system including a controller die such as a memory chip, a memory card, or a solid state drive (SSD). The term "semiconductor storage device" may mean a configuration including a host computer such as a smartphone, a tablet terminal, and a personal computer.

The term "control circuit" used in the present specification may mean a peripheral circuit such as a sequencer provided on a memory die, may mean, for example, a controller die or a controller chip connected to the memory die, or may mean a configuration that includes both the meanings.

In the present specification, when a first component is said to be "electrically connected" to a second component, the first component may be directly connected to the second component, or the first component may be connected to the second component via a wiring, a semiconductor member, a transistor, or the like. For example, when three transistors are connected in series, the first transistor is "electrically connected" to the third transistor even though the second transistor is in an OFF state.

In the present specification, a case where the first component is said to be "connected between" the second component and the third component may mean that the first component, the second component, and the third component are connected in series and the second component is connected to the third component via the first component.

In the present specification, a case where a circuit or the like is said to "cause two wirings and the like to be electrically connected" may mean, for example, that the circuit or the like includes a transistor and the like, the transistor and the like are provided on a current path between the two wirings and the like, and the transistor and the like turn into an ON state.

In the present specification, a predetermined direction parallel to an upper surface of a substrate is referred to as an X direction, a direction which is parallel to the upper surface of the substrate and is perpendicular to the X direction is referred to as a Y direction, and a direction perpendicular to the upper surface of the substrate is referred to as a Z direction.

In the present specification, a direction along a predetermined surface is referred to as a first direction, a direction intersecting the first direction along the predetermined surface is referred to as a second direction, and a direction intersecting the predetermined surface is referred to as a third direction. The first direction, the second direction, and the third direction may or may not correspond to any of the X direction, the Y direction, and the Z direction.

In the present specification, expressions such as "up" and "down" are based on the substrate. For example, a direction away from the substrate along the Z direction is referred to as up, and a direction toward the substrate along the Z direction is referred to as down. Further, when referring to a lower surface or a lower end of a certain component, it means a surface or an end portion on the substrate side of this component. When referring to an upper surface or an upper end, it means a surface or an end portion of this component on an opposite side of the substrate. A surface intersecting the X direction or the Y direction is referred to as a side surface or the like.

First Embodiment

Circuit Configuration

Figure 2:
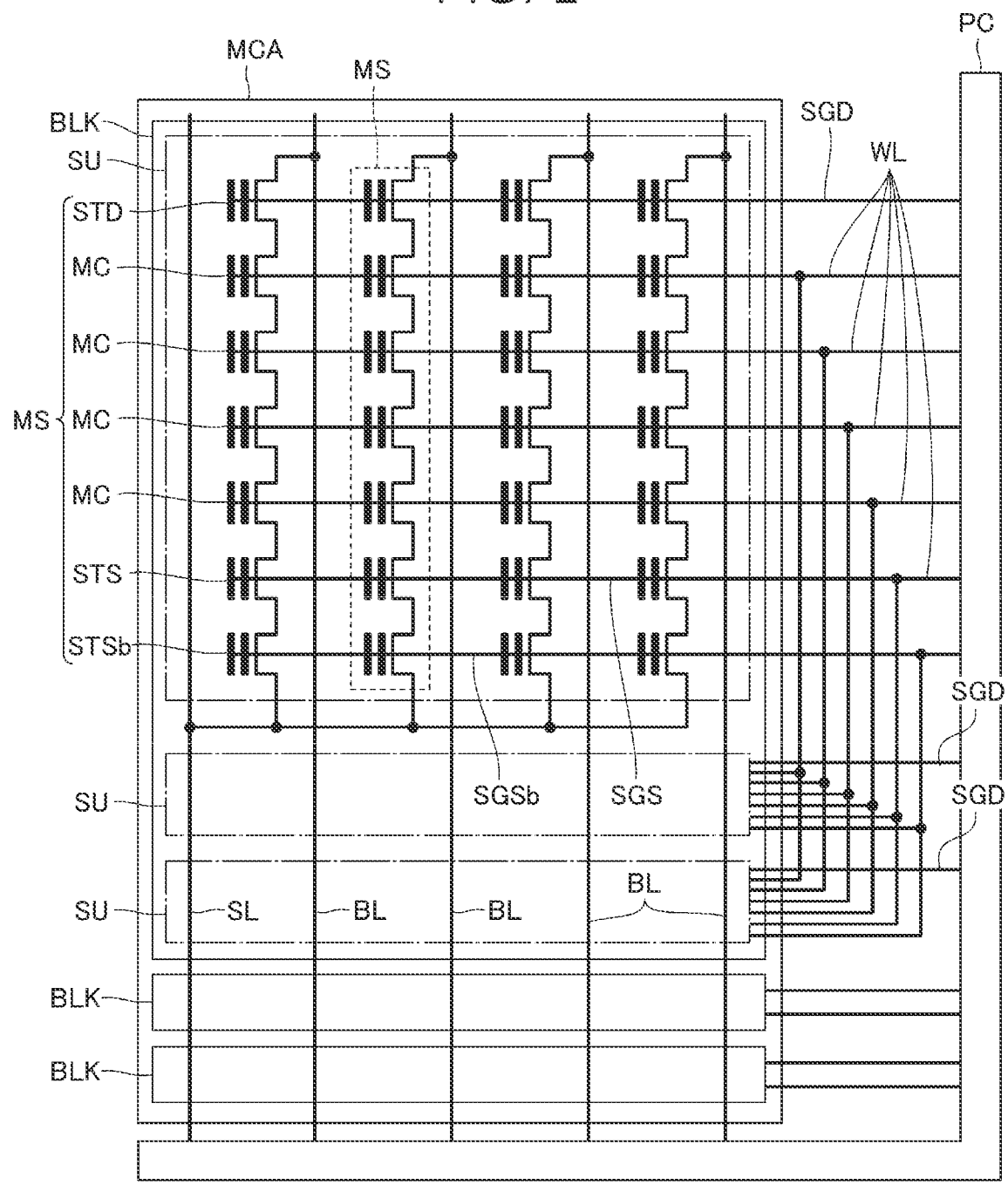
FIG. 2 is a schematic circuit diagram illustrating a partial configuration of the semiconductor storage device.
Figure 3:
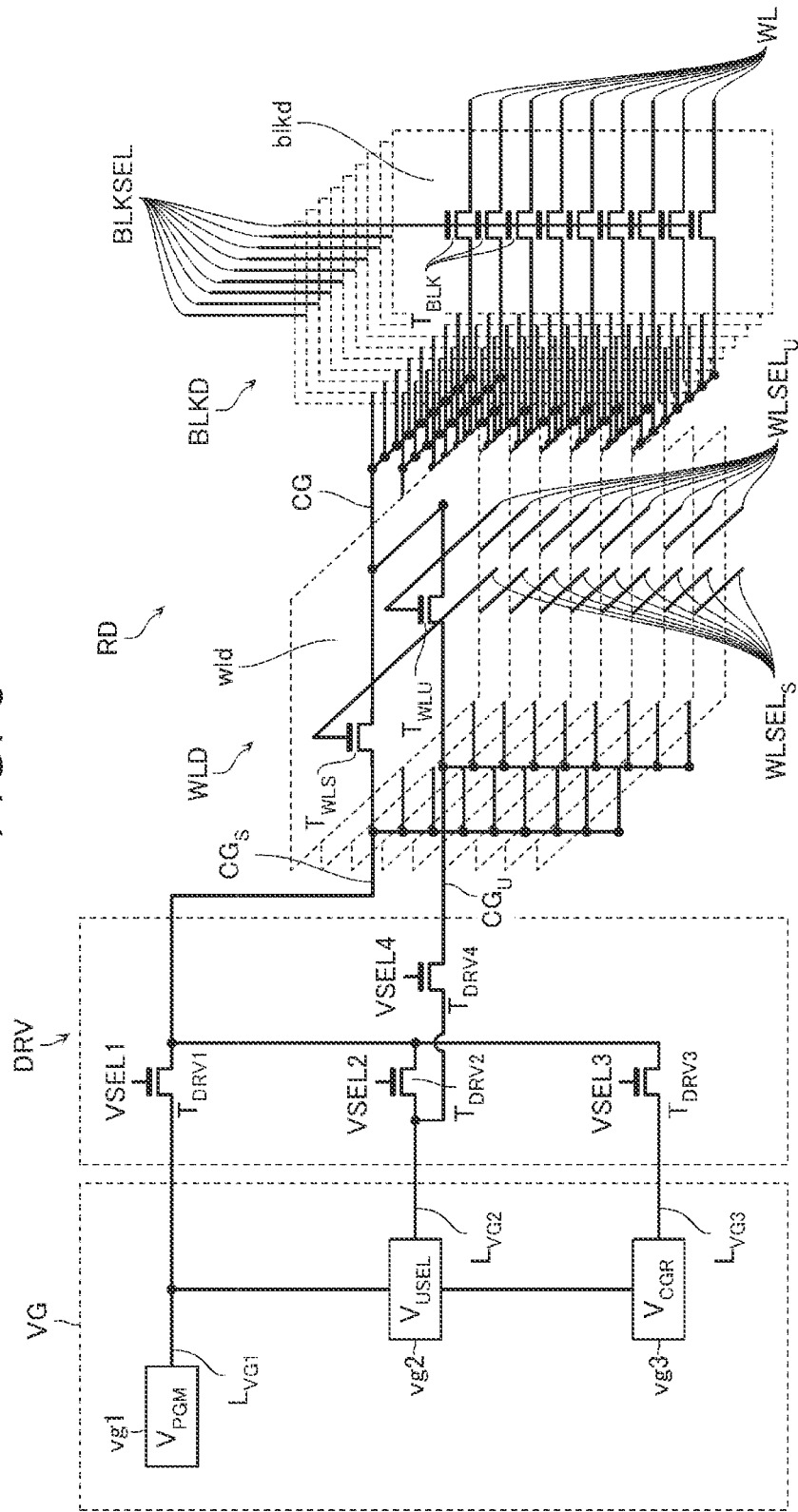
FIG. 3 is a schematic circuit diagram illustrating a partial configuration of the semiconductor storage device.
Figure 4:
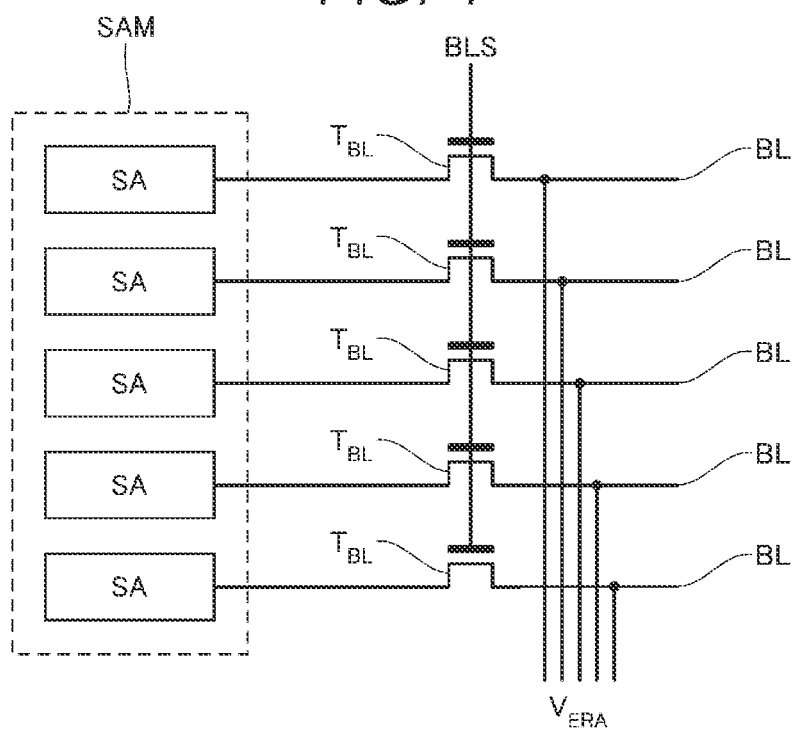
FIG. 4 is a schematic circuit diagram illustrating a partial configuration of the semiconductor storage device.

FIG. 1 is a schematic block diagram illustrating a configuration of a semiconductor storage device according to a first embodiment. FIGS. 2 to 4 are schematic circuit diagrams illustrating a partial configuration of the semiconductor storage device.

FIG. 1 illustrates a plurality of control terminals and the like. The plurality of control terminals may be represented as control terminals corresponding to a high active signal (positive logic signal). The plurality of control terminals may be represented as control terminals corresponding to a low active signal (negative logic signal). The plurality of control terminals may be represented as control terminals corresponding to both the high active signal and the low active signal. In FIG. 1, the reference sign of the control terminal corresponding to the low active signal includes an overline. In the present specification, the reference sign of the control terminal corresponding to the low active signal includes a slash ("/"). The illustration of FIG. 1 is an example, and the specific form may be adjusted as appropriate. For example, some or all of high active signals may be set to low active signals, or some or all of low active signals may be set to high active signals.

As illustrated in FIG. 1, the semiconductor storage device includes a memory cell array MCA and a peripheral circuit PC. The peripheral circuit PC includes a voltage generation circuit VG, a row decoder RD, a sense amplifier module SAM, and a sequencer SQC. The peripheral circuit PC further includes a cache memory CM, an address register ADR, a command register CMR, and a status register STR. The peripheral circuit PC further includes an input/output control circuit I/O and a logic circuit CTR.

Circuit Configuration of Memory Cell Array MCA

As illustrated in FIG. 2, the memory cell array MCA includes a plurality of memory blocks BLK. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. The other end of each of the plurality of memory strings MS is connected to the peripheral circuit PC via a common source line SL.

The memory string MS includes a drain-side select transistor STD, a plurality of memory cells (memory transistors) MC, a source-side select transistor STS, and a source-side select transistor STSb. The drain-side select transistor STD, the plurality of memory cells MC, the source-side select transistor STS, and the source-side select transistor STSb are connected in series between the bit line BL and the source line SL. The drain-side select transistor STD, the source-side select transistor STS, and the source-side select transistor STSb may be simply referred below to as select transistors (STD, STS, and STSb).

The memory cell MC is a field effect transistor. The memory cell MC includes a semiconductor layer, a gate insulating film, and a gate electrode. The semiconductor layer functions as a channel region. The gate insulating film includes a charge storage film. The threshold voltage of the memory cell MC changes depending on the charge quantity in the charge storage film. The memory cell MC stores data of one bit or a plurality of bits. Each of the gate electrodes of the plurality of memory cells MC corresponding to one memory string MS is implemented by a portion of the word line WL. Each word line WL functions as the gate electrodes of the memory cells MC in all memory strings MS in one memory block BLK.

The select transistors (STD, STS, and STSb) are field effect transistors. Each of the select transistors (STD, STS, and STSb) includes a semiconductor layer, a gate insulating film, and a gate electrode. The semiconductor layer functions as a channel region. The gate electrodes of the select transistors (STD, STS, and STSb) are implemented by portions of select gate lines (SGD, SGS, and SGSb), respectively. One drain-side select gate line SGD functions as gate electrodes of drain-side select transistors STD in all memory strings MS in one string unit SU. One source-side select gate line SGS functions as gate electrodes of source-side select transistors STS in all memory strings MS in one memory block BLK. One source-side select gate line SGSb functions as gate electrodes of source-side select transistors STSb in all memory strings MS in one memory block BLK.

Circuit Configuration of Voltage Generation Circuit VG

The voltage generation circuit VG (FIG. 1) includes a plurality of voltage generation units vg1 to vg3, for example, as illustrated in FIG. 3. The voltage generation units vg1 to vg3 generate voltages of predetermined magnitudes in a read operation, a write operation, and an erasing operation, and output the generated voltages via voltage supply lines $L_{VG1}$, $L_{VG2}$, and $L_{VG3}$. The operation voltage output from each of the voltage generation units vg1 to vg3 is appropriately adjusted in accordance with a control signal from the sequencer SQC or the like.

The voltage generation unit vg1 is a step-up circuit such as a charge pump circuit. The voltage generation unit vg1 steps up a power-source voltage $V_{CC}$ in a write operation and outputs a voltage supplied to the selected word line (voltage $V_{PGM}$-α (FIG. 13) which will be described later). The voltage generation unit vg1 may step up the power-source voltage $V_{CC}$ in an erasing operation and output an erasing voltage $V_{ERA}$ which will be described later. The output terminal of the voltage generation unit vg1 is connected to the voltage supply line $L_{VG1}$. The voltage supply line $L_{VG1}$ is electrically connected to the voltage generation unit vg2.

The voltage generation unit vg2 is, for example, a step-down circuit such as a regulator. The voltage generation unit vg2 outputs a read pass voltage $V_{READ}$, which will be described later, in a read operation. The voltage generation unit vg2 outputs a write pass voltage $V_{PASS}$, which will be described later, in a write operation.

The voltage generation unit vg3 is, for example, a step-down circuit such as a regulator. The voltage generation unit vg3 outputs a read voltage, which will be described later, in a read operation. The voltage generation unit vg3 outputs a verify voltage, which will be described later, in a write operation.

Circuit Configuration of Row Decoder RD

For example, as illustrated in FIG. 3, the row decoder RD includes a block decoder BLKD, a word line decoder WLD, a driver circuit DRV, and an address decoder (not illustrated).

The block decoder BLKD includes a plurality of block decoding units blkd. The plurality of block decoding units blkd correspond to the plurality of memory blocks BLK in the memory cell array MCA. The block decoding unit blkd includes a plurality of transistors $T_{BLK}$. The plurality of transistors $T_{BLK}$ correspond to the plurality of word lines WL in the memory block BLK. The transistor $T_{BLK}$ is, for example, a field effect NMOS transistor. The drain electrode of the transistor $T_{BLK}$ is connected to the word line WL. The source electrode of the transistor $T_{BLK}$ is connected to a voltage supply line CG. The voltage supply line CG is connected to all block decoding units blkd in the block decoder BLKD. The gate electrode of the transistor $T_{BLK}$ is connected to a signal supply line BLKSEL. A plurality of signal supply lines BLKSEL are provided corresponding to all the block decoding units blkd. The signal supply line BLKSEL is connected to all the transistors $T_{BLK}$ in the block decoding unit blkd.

In a read operation, a write operation, and the like, for example, the voltage of one signal supply line BLKSEL corresponding to a block address included in address data $D_{ADD}$ stored in the address register ADR (FIG. 1) is in an "H" state, and voltages of other signal supply lines BLKSEL are in an "L" state. For example, a predetermined drive voltage having a positive magnitude is supplied to the one signal supply line BLKSEL, and a ground voltage $V_{SS}$ or the like is supplied to other signal supply lines BLKSEL. Thus, all word lines WL in one memory block BLK corresponding to this block address are electrically connected to all voltage supply lines CG. In addition, all word lines WL in the other memory blocks BLK are in a floating state.

The word line decoder WLD includes a plurality of word line decoding units wld. The plurality of word line decoding units wld correspond to a plurality of memory cells MC in the memory string MS. In the example in FIG. 3, the word line decoding unit wld includes two transistors $T_{WLS}$ and $T_{WLU}$. The transistors $T_{WLS}$ and $T_{WLU}$ are, for example, field effect NMOS transistors. The drain electrodes of the transistors $T_{WLS}$ and $T_{WLU}$ are connected to the voltage supply line CG. The source electrode of the transistor $T_{WLS}$ is connected to a voltage supply line $CG_S$. The source electrode of the transistor $T_{WLU}$ is connected to a voltage supply line $CG_U$. The gate electrode of the transistor $T_{WLS}$ is connected to a signal supply line $WLSEL_S$. The gate electrode of the transistor $T_{WLU}$ is connected to a signal supply line $WLSEL_U$. A plurality of signal supply lines $WLSEL_S$ are provided corresponding to one transistors $T_{WLS}$ in all word line decoding units wld. A plurality of signal supply lines $WLSEL_U$ are provided corresponding to the other transistors $T_{WLU}$ in all the word line decoding units wld.

In a read operation, a write operation, and the like, for example, the voltage of the signal supply line $WLSEL_S$ corresponding to one word line decoding unit wld corresponding to a page address included in the address data $D_{ADD}$ in the address register ADR (FIG. 1) is in the "H" state, and the voltage of the corresponding signal supply line $WLSEL_U$ is in the "L" state. The voltages of the signal supply lines $WLSEL_S$ corresponding to the other word line decoding units wld are in the "L" state, and the voltages of the corresponding signal supply lines $WLSEL_U$ are in the state. A voltage corresponding to the selected word line $WL_S$ is supplied to the voltage supply line $CG_S$. A voltage corresponding to the unselected word line $WL_U$ is supplied to the voltage supply line $CG_U$. Thus, the voltage corresponding to the selected word line $WL_S$ is supplied to one word line WL corresponding to the page address. In addition, the voltage corresponding to the unselected word line $WL_U$ is supplied to the other word lines WL.

The driver circuit DRV includes, for example, four transistors $T_{DRV1}$ to $T_{DRV4}$. The transistors $T_{DRV1}$ to $T_{DRV4}$ are, for example, field effect NMOS transistors. The drain electrodes of the transistors $T_{DRV1}$ to $T_{DRV3}$ are connected to the voltage supply line $CG_S$. The drain electrode of the transistor $T_{DRV4}$ is connected to the voltage supply line $CG_U$. The source electrode of the transistor $T_{DRV1}$ is connected to the output terminal of the voltage generation unit vg1 via the voltage supply line $L_{VG1}$. The source electrodes of the transistors $T_{DRV2}$ and $T_{DRV4}$ are connected to the output terminal of the voltage generation unit vg2 via the voltage supply line $L_{VG2}$. The source electrode of the transistor $T_{DRV3}$ is connected to the output terminal of the voltage generation unit vg3 via the voltage supply line $L_{VG3}$. Signal supply lines VSEL1 to VSEL4 are connected to the gate electrodes of the transistors $T_{DRV1}$ to $T_{DRV4}$, respectively.

In a read operation, a write operation, and the like, for example, the voltage of one of the plurality of signal supply lines VSEL1 to VSEL3 corresponding to the voltage supply line $CG_S$ is in the "H" state, and the voltages of the others are in the "L" state. The voltage of the signal supply line VSEL4 corresponding to the voltage supply line $CG_U$ is in the "H" state.

The address decoder (not illustrated) uses, as the reference, for example, the row address RA included in the address data $D_{ADD}$ in the address register ADR (FIG. 1) subsequently according to the control signal from the sequencer SQC (FIG. 1). The row address RA includes the block address and the page address described above. The address decoder controls the voltages of the signal supply lines BLKSEL, $WLSEL_S$, and $WLSEL_U$ to the "H" state or the "L" state.

In the example in FIG. 3, the row decoder RD includes one block decoding unit blkd for each memory block BLK.

This configuration may be changed as appropriate. For example, one block decoding unit blkd may be provided for each of two or more memory blocks BLK.

Circuit Configuration of Sense Amplifier Module SAM

The sense amplifier module SAM includes a plurality of sense amplifiers SA, for example, as illustrated in FIG. 4. The plurality of sense amplifiers SA are electrically connected to the plurality of bit lines BL, respectively. A plurality of transistors $T_{BL}$ are provided on the current paths between the plurality of sense amplifiers SA and the plurality of bit lines BL. The gate electrodes of the plurality of transistors $T_{BL}$ are connected to a common signal supply line BLS. The drain electrodes of the plurality of transistors $T_{BL}$ are electrically connected to a configuration (for example, voltage generation unit vg1 in FIG. 3) that outputs an erasing voltage $V_{ERA}$, which will be described later, in addition to the bit line BL.

Circuit Configuration of Cache Memory CM

The cache memory CM (FIG. 1) includes a plurality of latch circuits. The plurality of latch circuits are connected to the sense amplifier module SAM via a wiring DBUS. Pieces of data DAT included in the plurality of latch circuits are subsequently transferred to the sense amplifier module SAM or the input/output control circuit I/O.

A decoding circuit (not illustrated) and a switch circuit (not illustrated) are connected to the cache memory CM. The decoding circuit decodes a column address CA included in the address data $D_{ADD}$ in the address register ADR. The switch circuit causes the latch circuit corresponding to the column address CA to be electrically connected to a bus DB (FIG. 1) in accordance with the output signal of the decoding circuit.

Circuit Configuration of Sequencer SQC

The sequencer SQC (FIG. 1) outputs an internal control signal to the row decoder RD, the sense amplifier module SAM, and the voltage generation circuit VG in accordance with command data $D_{CMD}$ stored in the command register CMR. The sequencer SQC outputs status data $D_{ST}$ indicating the state of the sequencer itself to the status register STR as appropriate.

The sequencer SQC generates a ready/busy signal and outputs the generated ready/busy signal to a terminal RY//BY. Access to the semiconductor storage device is basically prohibited during a period when the voltage of the terminal RY//BY is in the "L" state. The access to the semiconductor storage device is permitted during a period when the voltage of the terminal RY//BY is in the "H" state.

Circuit Configuration of Input/output Control Circuit I/O

The input/output control circuit I/O includes data signal input/output terminals DQ0 to DQ7, toggle signal input/output terminals DQS and /DQS, a plurality of input circuits, a plurality of output circuits, a shift register, and a buffer circuit. The plurality of input circuits, the plurality of output circuits, the shift register, and the buffer circuit are connected to terminals to which the power-source voltage $V_{CCQ}$ and the ground voltage $V_{SS}$ are supplied, respectively.

Data input via the data signal input/output terminals DQ0 to DQ7 is output from the buffer circuit to the cache memory CM, the address register ADR, or the command register CMR in accordance with the internal control signal from the logic circuit CTR. Data output via the data signal input/output terminals DQ0 to DQ7 is input to the buffer circuit from the cache memory CM or the status register STR in accordance with the internal control signal from the logic circuit CTR.

The plurality of input circuits include, for example, comparators connected to any one of the data signal input/output terminals DQ0 to DQ7 or to both of the toggle signal input/output terminals DQS and /DQS. The plurality of output circuits include, for example, OCD (Off Chip Driver) circuits connected to any one of the data signal input/output terminals DQ0 to DQ7 or to either of the toggle signal input/output terminals DQS and /DQS.

Circuit Configuration of Logic Circuit CTR

The logic circuit CTR (FIG. 1) receives an external control signal via external control terminals /CEn, CLE, ALE, /WE, /RE, and RE, and outputs the internal control signal to the input/output control circuit I/O in response to the reception.

Structure of Semiconductor Storage Device

Figure 5:
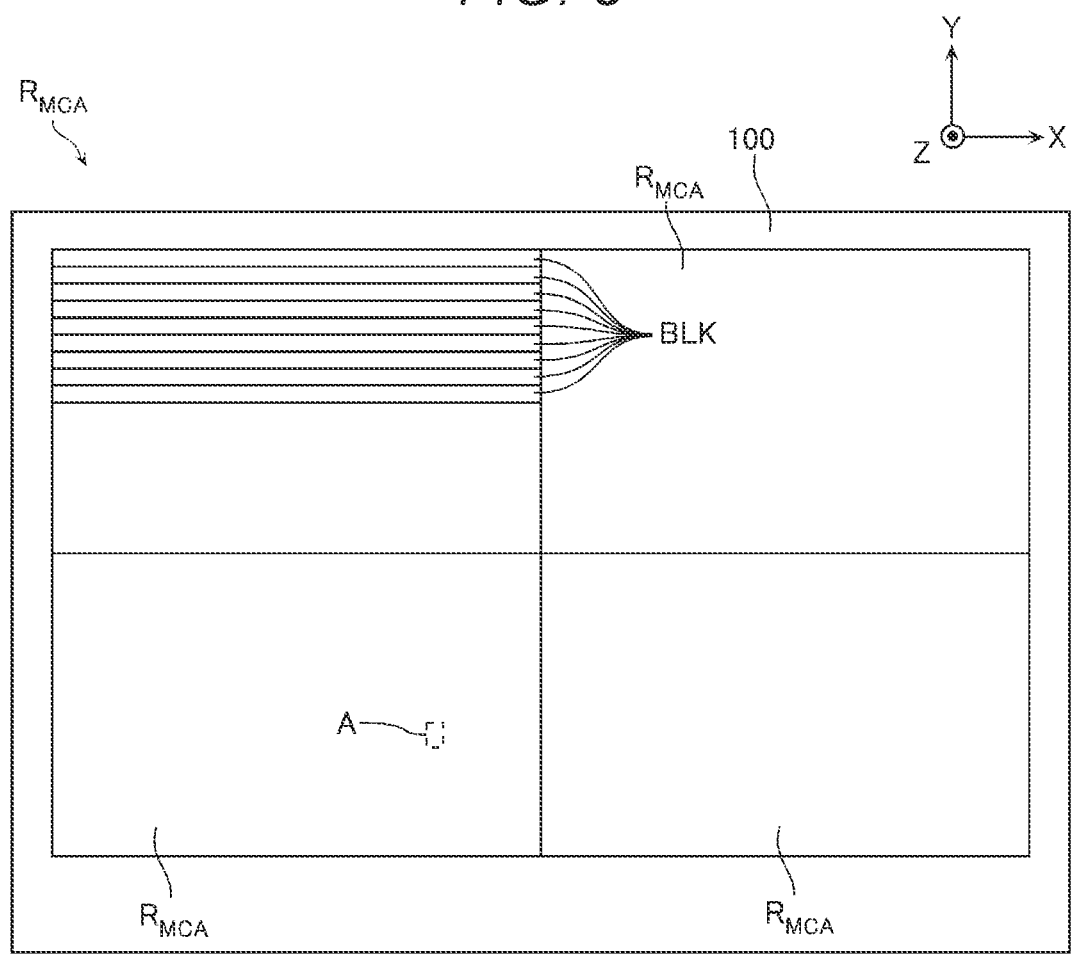
FIG. 5 is a plan view schematically illustrating a partial configuration of the semiconductor storage device.
Figure 6:
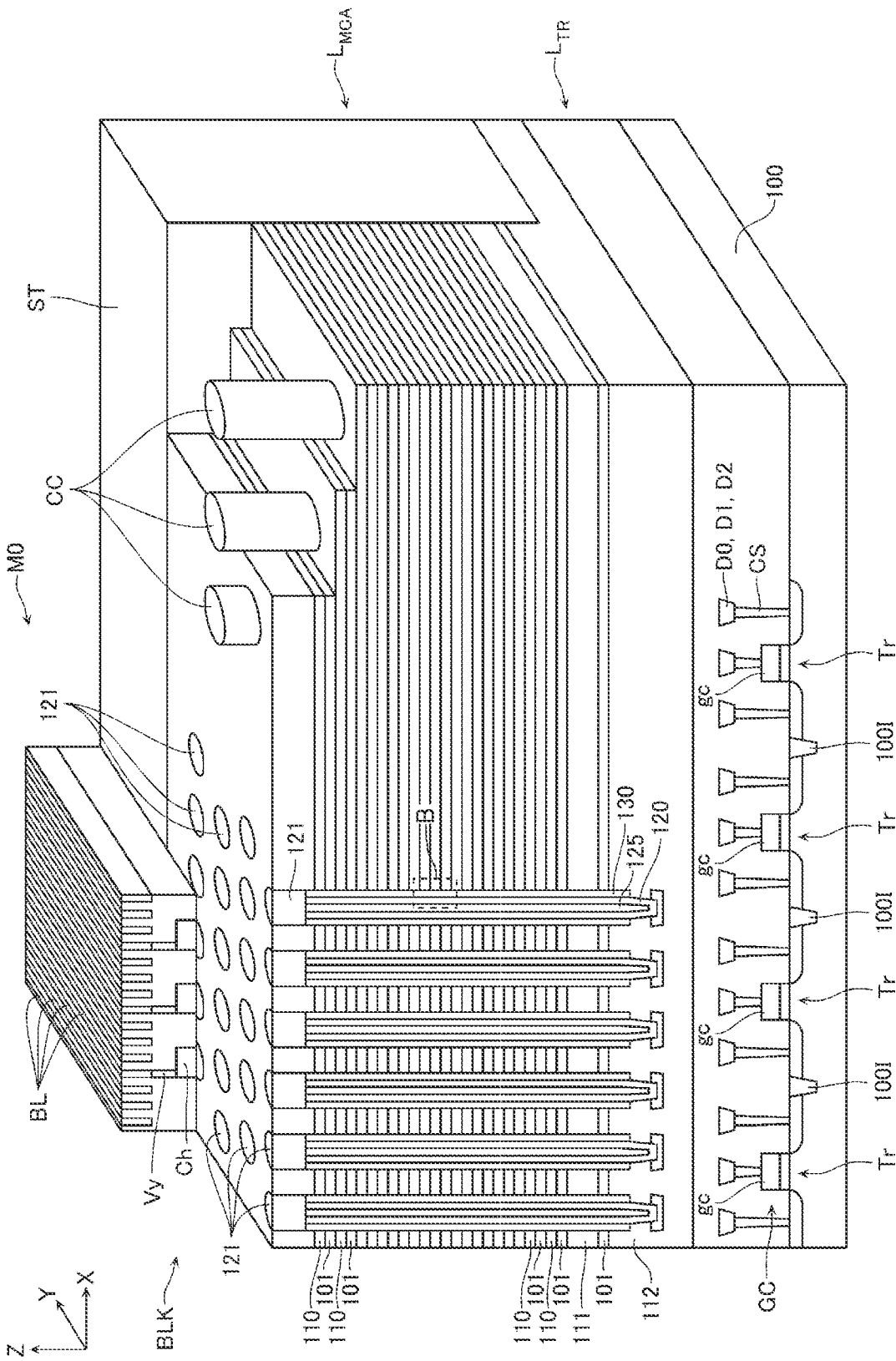
FIG. 6 is a perspective view schematically illustrating a partial configuration of the semiconductor storage device.
Figure 7:
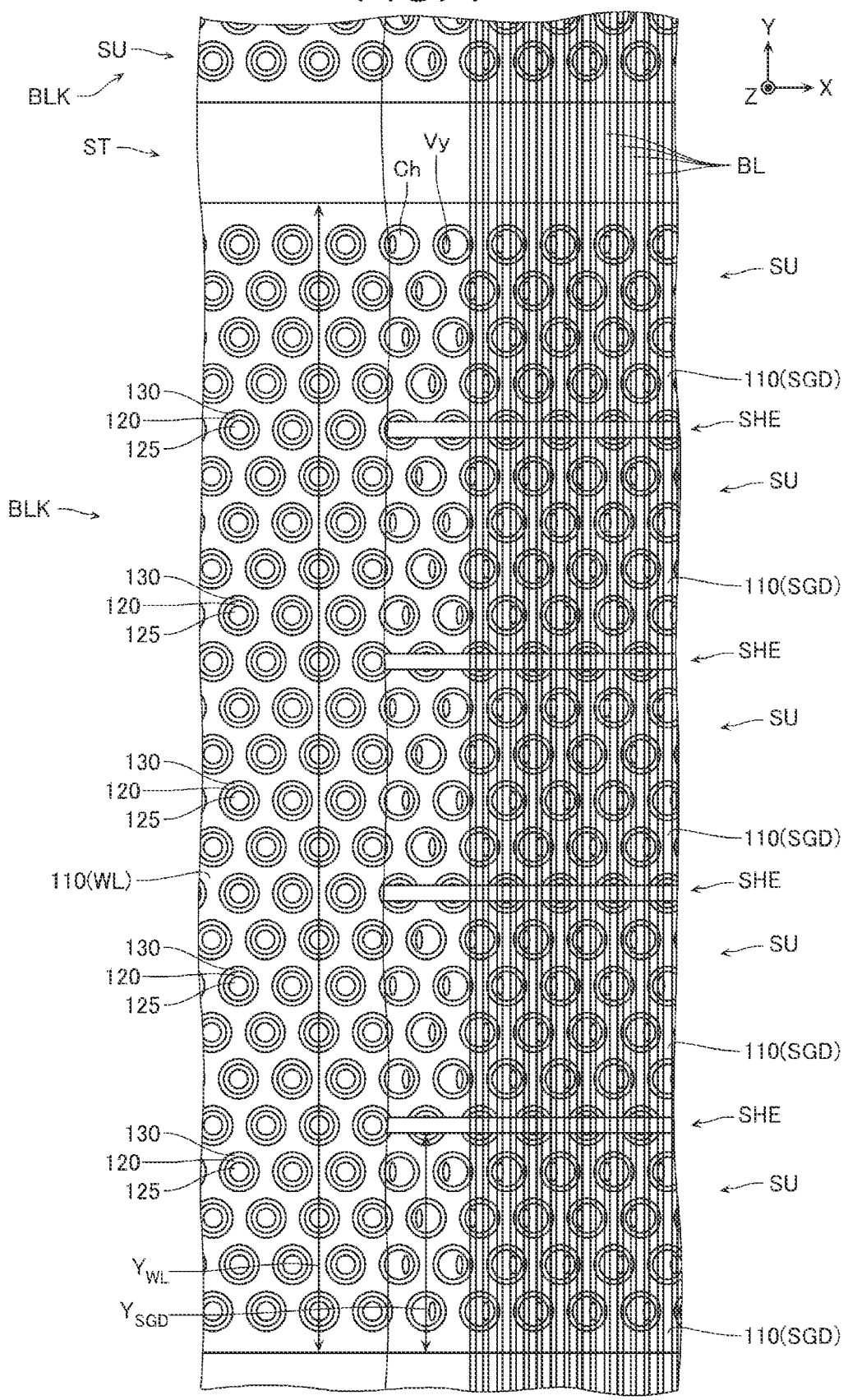
FIG. 7 is an enlarged view schematically illustrating a portion indicated by A in FIG. 5.
Figure 8:
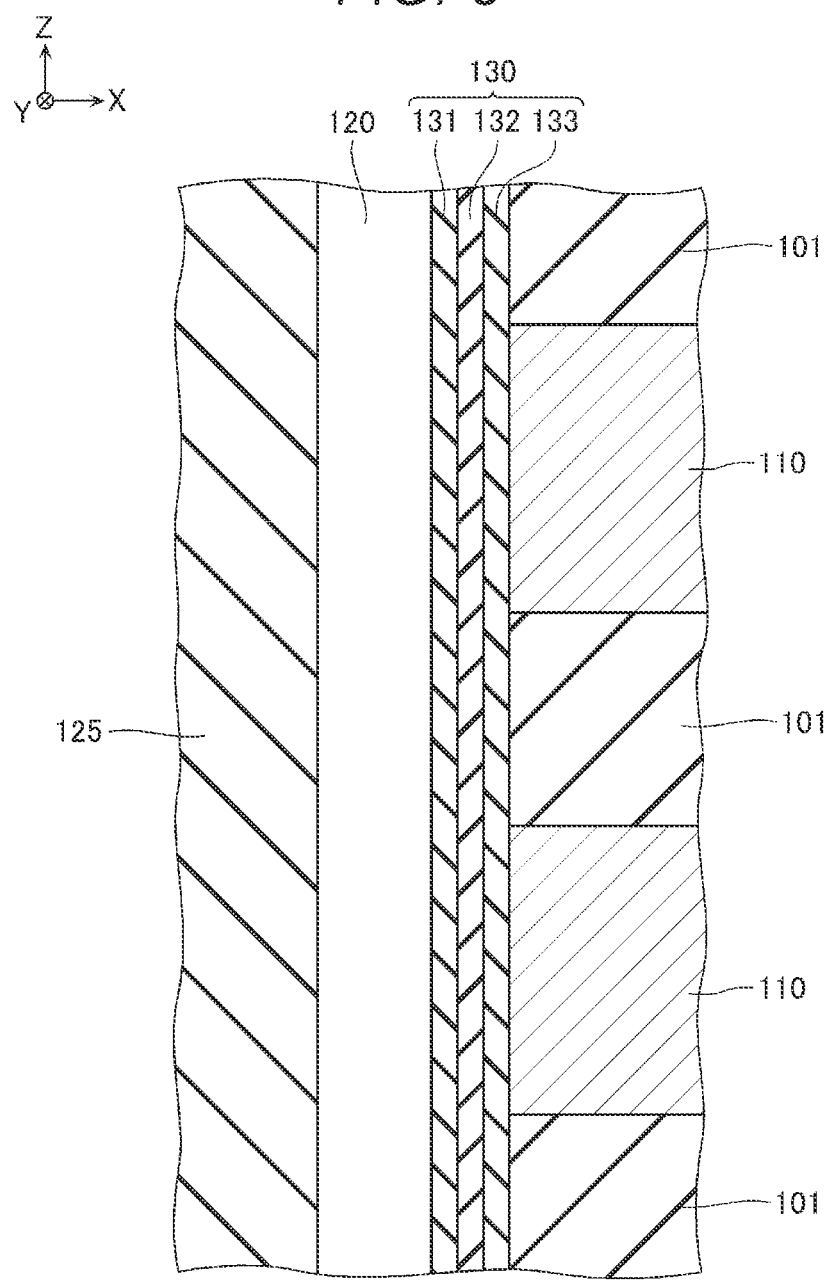
FIG. 8 is an enlarged view schematically illustrating a portion indicated by B in FIG. 6.

FIG. 5 is a plan view schematically illustrating a partial configuration of the semiconductor storage device. FIG. 6 is a perspective view schematically illustrating a partial configuration of the semiconductor storage device. FIG. 6 is a diagram illustrating a schematic configuration of the semiconductor storage device, and does not illustrate the number, shape, arrangement, or the like of specific components. FIG. 7 is an enlarged view schematically illustrating a portion indicated by A in FIG. 5. FIG. 8 is an enlarged view schematically illustrating a portion indicated by B in FIG. 6.

The semiconductor storage device includes a semiconductor substrate 100, for example, as illustrated in FIG. 5. In the example illustrated in FIG. 5, the semiconductor substrate 100 includes four memory cell array regions $R_{MCA}$ arranged in the X direction and the Y direction.

For example, as illustrated in FIG. 6, the semiconductor storage device includes the semiconductor substrate 100, a transistor layer $L_{TR}$ provided on the semiconductor substrate 100, a memory cell array layer $L_{MCA}$ provided above the transistor layer $L_{TR}$, and a wiring layer M0 provided above the memory cell array layer $L_{MCA}$.

Structure of Semiconductor Substrate 100

The semiconductor substrate 100 is a semiconductor substrate configured with P-type silicon (Si) containing P-type impurities such as boron (B), for example. An N-type well region containing N-type impurities such as phosphorus (P), a P-type well region containing P-type impurities such as boron (B), a semiconductor substrate region in which the N-type well region and the P-type well region are not provided, and an insulating region 100I are provided on the surface of the semiconductor substrate 100.

Structure of Transistor Layer $L_{TR}$

For example, as illustrated in FIG. 6, a wiring layer GC is provided on the upper surface of the semiconductor substrate 100 via an insulating layer. The wiring layer GC includes a plurality of electrodes gc facing the surface of the semiconductor substrate 100. The plurality of electrodes gc functions as gate electrodes of a plurality of transistors Tr, electrodes of a plurality of capacitors, and the like, that constitute the peripheral circuit PC, respectively. Each of the plurality of electrodes gc is connected to a contact electrode CS. The contact electrode CS may include, for example, a stacked film of a barrier conductive film made of titanium nitride (TiN) or the like and a metal film made of tungsten (W) or the like. The plurality of contact electrodes CS are connected to a plurality of wirings in the wiring layers D0, D1, and D2. The plurality of wirings may include, for example, a stacked film of a barrier conductive film made of titanium nitride (TiN) or the like and a metal film made of tungsten (W) or the like.

Structure of Memory Cell Array Layer $L_{MCA}$

For example, as illustrated in FIG. 5, a plurality of memory blocks BLK arranged in the Y direction are provided in the memory cell array region $R_{MCA}$ of the memory cell array layer $L_{MCA}$. For example, as illustrated in FIG. 7, the memory block BLK includes a plurality of string units SU arranged in the Y direction. An inter-block insulating layer ST made of silicon oxide ($SiO_2$) or the like is provided between two memory blocks BLK adjacent to each other in the Y direction. For example, as illustrated in FIG. 7, an inter-string unit insulating layer SHE made of silicon oxide ($SiO_2$) or the like is provided between two string units SU adjacent to each other in the Y direction.

For example, as illustrated in FIG. 6, the memory block BLK includes a plurality of conductive layers 110 arranged in the Z direction, a plurality of semiconductor pillars 120 extending in the Z direction, and a plurality of gate insulating films 130 respectively provided between the plurality of conductive layers 110 and the plurality of semiconductor pillars 120.

The conductive layer 110 is a substantially plate-shaped conductive layer extending in the X direction. The conductive layer 110 may include a stacked film of a barrier conductive film made of titanium nitride (TiN) or the like and a metal film made of tungsten (W) or the like. The conductive layer 110 may contain, for example, polycrystalline silicon containing impurities such as phosphorus (P) or boron (B). Insulating layers 101 made of silicon oxide ($SiO_2$) or the like are provided between the plurality of conductive layers 110 arranged in the Z direction. A contact electrode CC extending in the Z direction is provided at one end portion of the conductive layer 110 in the X direction.

For example, as illustrated in FIG. 6, a conductive layer 111 is provided below the conductive layer 110. The conductive layer 111 may contain, for example, polycrystalline silicon containing impurities such as phosphorus (P) or boron (B). An insulating layer 101 is provided between the conductive layer 111 and the conductive layer 110.

A conductive layer 112 is provided below the conductive layer 111. The conductive layer 112 may contain, for example, polycrystalline silicon containing impurities such as phosphorus (P) or boron (B). The conductive layer 112 may include, for example, a metal layer made of tungsten (W) or the like, a conductive layer made of tungsten silicide or the like, or other conductive layers. An insulating layer 101 is provided between the conductive layer 112 and the conductive layer 111.

The conductive layer 112 functions as the source line SL (FIG. 2). The conductive layer 112 is provided in common for all the memory blocks BLK in the memory cell array region $R_{MCA}$ (FIG. 5), for example.

The conductive layer 111 functions as the source-side select gate line SGSb (FIG. 2) and the gate electrodes of the plurality of source-side select transistors STSb connected to the source-side select gate line SGSb. The conductive layer 111 is electrically independent for each memory block BLK.

Among the plurality of conductive layers 110, one or a plurality of conductive layers 110 located on the lowest layer function as the source-side select gate line SGS (FIG. 2) and the gate electrodes of the plurality of source-side select transistors STS connected to the source-side select gate line SGS. The plurality of conductive layers 110 are electrically independent for each memory block BLK.

A plurality of conductive layers 110 located above the above-described conductive layers 110 function as the word line WL (FIG. 2) and the gate electrodes of the plurality of memory cells MC (FIG. 2) connected to the word line WL. The plurality of conductive layers 110 are electrically independent for each memory block BLK.

One or a plurality of conductive layers 110 located above the above-described conductive layers 110 function as the drain-side select gate line SGD and the gate electrodes of the plurality of drain-side select transistors STD (FIG. 2) connected to the drain-side select gate line SGD. For example, as illustrated in FIG. 7, the width $Y_{SGD}$ of the plurality of conductive layers 110 in the Y direction is smaller than the width $Y_{WL}$ of the other conductive layers 110 in the Y direction. For example, as illustrated in FIG. 7, the above-described inter-string unit insulating layer SHE is provided between two conductive layers 110 adjacent to each other in the Y direction. The plurality of conductive layers 110 are electrically independent for each string unit SU.

For example, as illustrated in FIG. 7, the semiconductor pillars 120 are arranged in the X direction and the Y direction in a predetermined pattern. The semiconductor pillars 120 function as channel regions of the plurality of memory cells MC and select transistors (STD, STS, and STSb) in one memory string MS (FIG. 2). The semiconductor pillar 120 is a semiconductor layer made of polycrystalline silicon (Si), for example. For example, as illustrated in FIG. 6, the semiconductor pillar 120 has a substantially cylindrical shape, and an insulating layer 125 made of silicon oxide or the like is provided at the central portion of the semiconductor pillar 120.

The outer peripheral surface of the semiconductor pillar 120 is surrounded by a plurality of conductive layers 110 and 111, and faces the plurality of conductive layers 110 and 111. The lower end of the semiconductor pillar 120 is connected to the conductive layer 112. The upper end of the semiconductor pillar 120 is connected to the bit line BL via an impurity region 121 containing N-type impurities such as phosphorus (P) and contact electrodes Ch and Vy. The bit lines BL extend in the Y direction and are arranged in the X direction.

The gate insulating film 130 has a substantially cylindrical shape that covers the outer peripheral surface of the semiconductor pillar 120. For example, as illustrated in FIG. 8, the gate insulating film 130 includes a tunnel insulating film 131, a charge storage film 132, and a block insulating film 133, which are stacked between the semiconductor pillar 120 and the conductive layer 110. The tunnel insulating film 131 and the block insulating film 133 are insulating films made of silicon oxide ($SiO_2$), for example. The charge storage film 132 is a film that is made of silicon nitride ($Si_3N_4$) and is capable of storing charges, for example. The tunnel insulating film 131, the charge storage film 132, and the block insulating film 133 have a substantially cylindrical shape, and extend in the Z direction along the outer peripheral surface of the semiconductor pillar 120 except for a contact portion between the semiconductor pillar 120 and the conductive layer 112.

FIG. 8 illustrates an example in which the gate insulating film 130 includes the charge storage film 132 made of silicon nitride or the like. The gate insulating film 130 may include, for example, a floating gate made of polycrystalline silicon containing N-type or P-type impurities.

Read Operation

Figure 9:
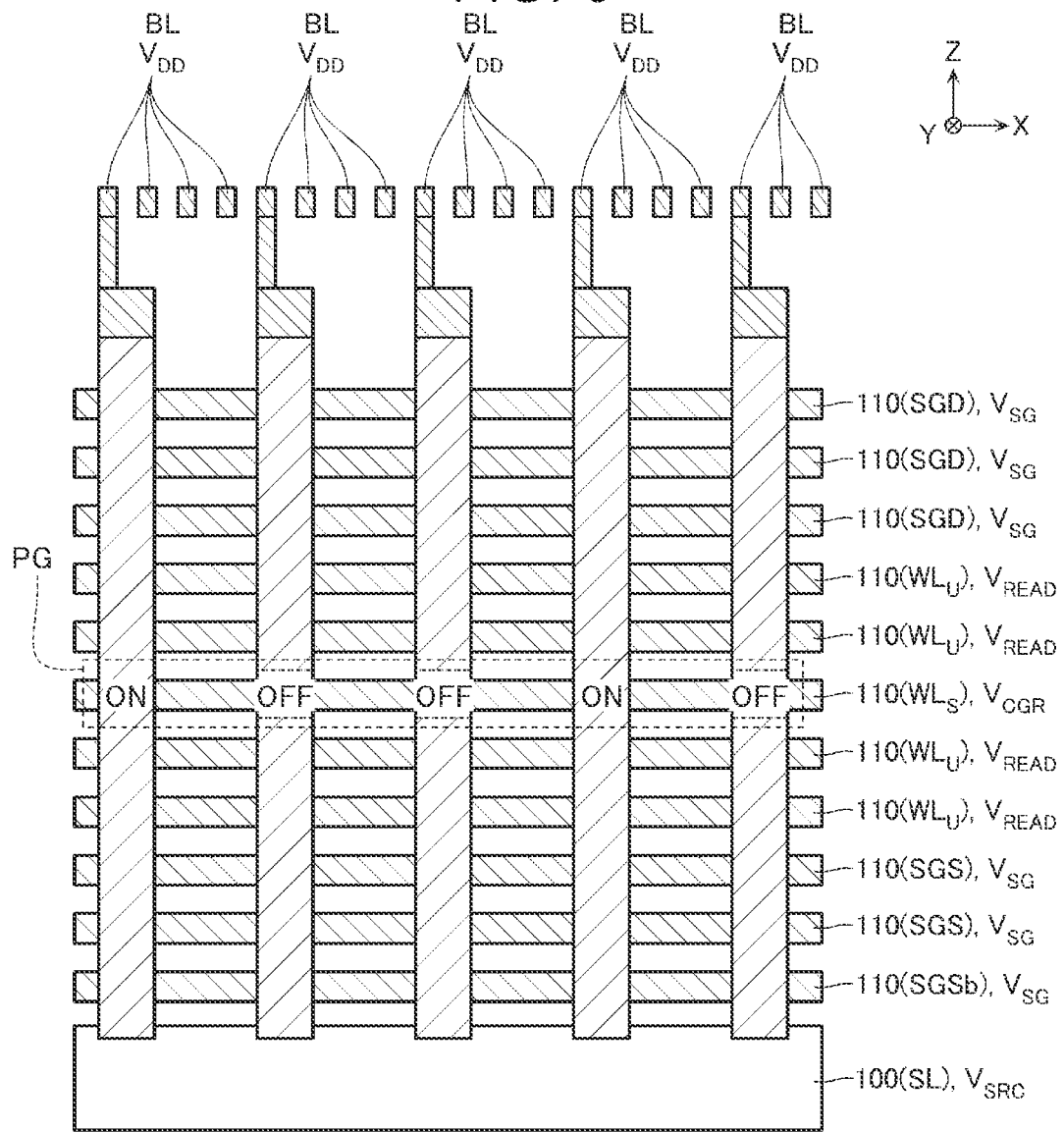
FIG. 9 is a cross-sectional view schematically illustrating a read operation.

Next, a read operation of the semiconductor storage device according to the present embodiment will be described. FIG. 9 is a cross-sectional view schematically illustrating the read operation.

In the following description, the word line WL as an operation target may be referred to as the selected word line $WL_S$, and other word lines WL may be referred to as the unselected word lines $WL_U$. In the following description, an example in which a read operation is performed on the memory cell MC connected to the selected word line $WL_S$ (may be referred to as a "selected memory cell MC" below)

among a plurality of memory cells MC in the string unit SU as an operation target will be described. In the following description, such a configuration including a plurality of selected memory cells MC may be referred to as a selected page PG.

In the read operation, for example, a voltage $V_{DD}$ is supplied to the bit line BL. A voltage $V_{SRC}$ is supplied to the source line SL. The voltage $V_{SRC}$ may be higher than the ground voltage $V_{SS}$ or equal to the ground voltage $V_{SS}$. The voltage $V_{DD}$ is higher than the voltage $V_{SRC}$.

In the read operation, a voltage $V_{SG}$ is supplied to the drain-side select gate line SGD. The voltage $V_{SG}$ is higher than the voltage $V_{DD}$. The voltage difference between the voltage $V_{SG}$ and the voltage $V_{DD}$ is greater than a threshold voltage when the drain-side select transistor STD functions as an NMOS transistor. Thus, an electron channel is formed in the channel region of the drain-side select transistor STD, and the voltage $V_{DD}$ is transferred.

In the read operation, the voltage $V_{SG}$ is supplied to the source-side select gate lines SGS and SGSb. The voltage $V_{SG}$ is higher than the voltage $V_{SRC}$. The voltage difference between the voltage $V_{SG}$ and the voltage $V_{SRC}$ is greater than a threshold voltage when the source-side select transistors STS and STSb function as NMOS transistors. Thus, an electron channel is formed in the channel region of the source-side select transistors STS and STSb, and the voltage $V_{SRC}$ is transferred.

In the read operation, the read pass voltage $V_{READ}$ is supplied to the unselected word line $WL_U$. The read pass voltage $V_{READ}$ is higher than the voltages $V_{DD}$ and $V_{SRC}$. The voltage difference between the read pass voltage $V_{READ}$ and the voltages $V_{DD}$ and $V_{SRC}$ is greater than a threshold voltage when the memory cell MC functions as an NMOS transistor, regardless of data recorded in the memory cell MC. Thus, an electron channel is formed in the channel region of the non-selected memory cell MC, and the voltages $V_{DD}$ and $V_{SRC}$ are transferred to the selected memory cell MC.

In the read operation, a read voltage $V_{CGR}$ is supplied to the selected word line $WL_S$. The read voltage $V_{CGR}$ is lower than the read pass voltage $V_{READ}$. The voltage difference between the read voltage $V_{CGR}$ and the voltage $V_{SRC}$ is greater than a threshold voltage of the memory cell MC in which some pieces of data are recorded. Thus, the memory cell MC in which some pieces of data are recorded turns into an ON state. Thus, a current flows through the bit line BL connected to such a memory cell MC. The voltage difference between the read voltage $V_{CGR}$ and the voltage $V_{SRC}$ is smaller than the threshold voltage of the memory cell MC in which some pieces of data are recorded. Thus, the memory cell MC in which some pieces of data are recorded turns into an OFF state. Thus, no current flows through the bit line BL connected to such a memory cell MC.

In the read operation, the sense amplifier module SAM (FIG. 1) detects whether or not a current flows through the bit line BL, and detects whether the memory cell MC is in the ON state or the OFF state, from the detection of the current. Then, the sense amplifier module SAM acquires data indicating the state of the memory cell MC from the detection of the ON state or the OFF state.

In the read operation, arithmetic processing such as AND and OR is performed on the data indicating the state of the memory cell MC as necessary, and the data recorded in the memory cell MC is calculated by the arithmetic processing.

Write Operation

Figure 10:
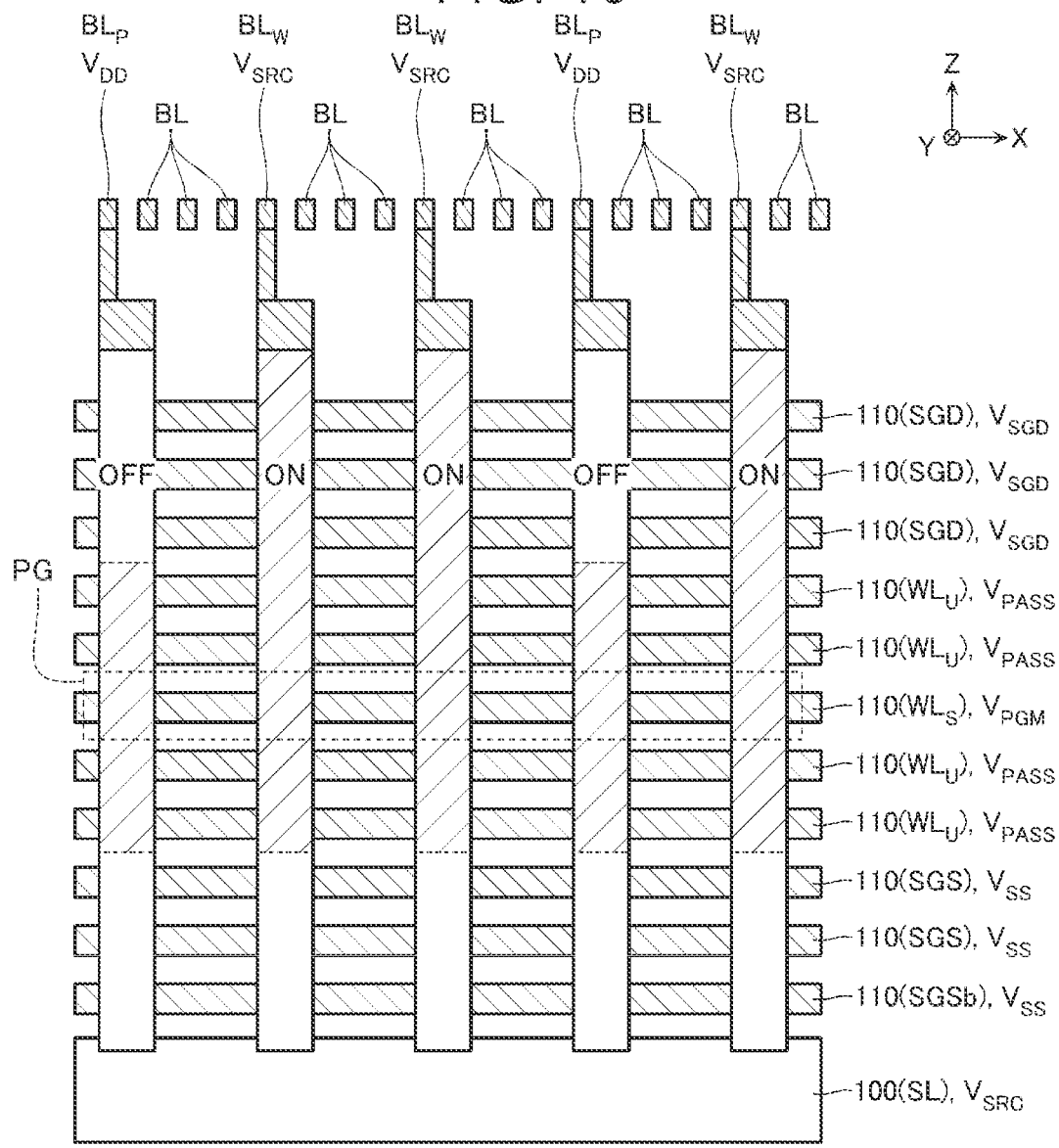
FIG. 10 is a cross-sectional view schematically illustrating a write operation.

Next, a write operation of the semiconductor storage device according to the present embodiment will be described. FIG. 10 is a cross-sectional view schematically illustrating the write operation.

In the following description, an example of performing a write operation on a plurality of selected memory cells MC corresponding to the selected page PG will be described.

In the write operation, for example, the voltage $V_{SRC}$ is supplied to a bit line $BL_W$ connected to the selected memory cell MC that adjusts the threshold voltage among the plurality of selected memory cells MC. The voltage $V_{DD}$ is supplied to a bit line $BL_P$ connected to the selected memory cell MC that does not adjust the threshold voltage among the plurality of selected memory cells MC. Among the plurality of selected memory cells MC, the selected memory cell MC that adjusts the threshold voltage may be referred to as a "write memory cell MC" below, and the selected memory cell MC that does not adjust the threshold voltage may be referred to an "inhibited memory cell MC" below.

In the write operation, a voltage $V_{SGD}$ is supplied to the drain-side select gate line SGD.

The voltage $V_{SGD}$ is higher than the voltage $V_{SRC}$. The voltage difference between the voltage $V_{SGD}$ and the voltage $V_{SRC}$ is greater than a threshold voltage when the drain-side select transistor STD functions as an NMOS transistor. Thus, an electron channel is formed in the channel region of the drain-side select transistor STD connected to the bit line $BL_W$, and the voltage $V_{SRC}$ is transferred.

The voltage difference between the voltage $V_{SGD}$ and the voltage $V_{DD}$ is smaller than the threshold voltage when the drain-side select transistor STD functions as an NMOS transistor. Thus, the drain-side select transistor STD connected to the bit line $BL_P$ turns into the OFF state.

In the write operation, the voltage $V_{SRC}$ is supplied to the source line SL, and the ground voltage $V_{SS}$ is supplied to the source-side select gate lines SGS and SGSb. Thus, the source-side select transistors STS and STSb turn into the OFF state.

In the write operation, the write pass voltage $V_{PASS}$ is supplied to the unselected word line $WL_U$. The write pass voltage $V_{PASS}$ is higher than the read pass voltage $V_{READ}$. The voltage difference between the write pass voltage $V_{PASS}$ and the voltage $V_{SRC}$ is greater than the threshold voltage when the memory cell MC functions as an NMOS transistor, regardless of data recorded in the memory cell MC. Thus, an electron channel is formed in the channel region of the non-selected memory cell MC, and the voltage $V_{SRC}$ is transferred to the write memory cell MC.

In the write operation, a program voltage $V_{PGM}$ is supplied to the selected word line $WL_S$. The program voltage $V_{PGM}$ is higher than the write pass voltage $V_{PASS}$.

Here, for example, as illustrated in FIG. 10, the voltage $V_{SRC}$ is supplied to the channel of the semiconductor pillar 120 connected to the bit line $BL_W$. A relatively large electric field is generated between the semiconductor pillar 120 and the selected word line $WL_S$ as described above. Thus, electrons in the channel of the semiconductor pillar 120 tunnel into the charge storage film 132 (FIG. 8) via the tunnel insulating film 131 (FIG. 8). As a result, the threshold voltage of the write memory cell MC increases.

The channel of the semiconductor pillar 120 connected to the bit line $BL_P$ is electrically in a floating state. The potential of this channel rises to about the write pass voltage $V_{PASS}$ due to capacitive coupling with the unselected word line $WL_U$. An electric field smaller than the above-described electric field is generated between the semiconductor pillar 120 and the selected word line $WL_S$ as described above. Thus, the electrons in the channel of the semiconductor pillar 120 do not tunnel into the charge storage film 132

(FIG. 8). Thus, the threshold voltage of the inhibited memory cell MC does not increase.

Erasing Operation

Figure 11:
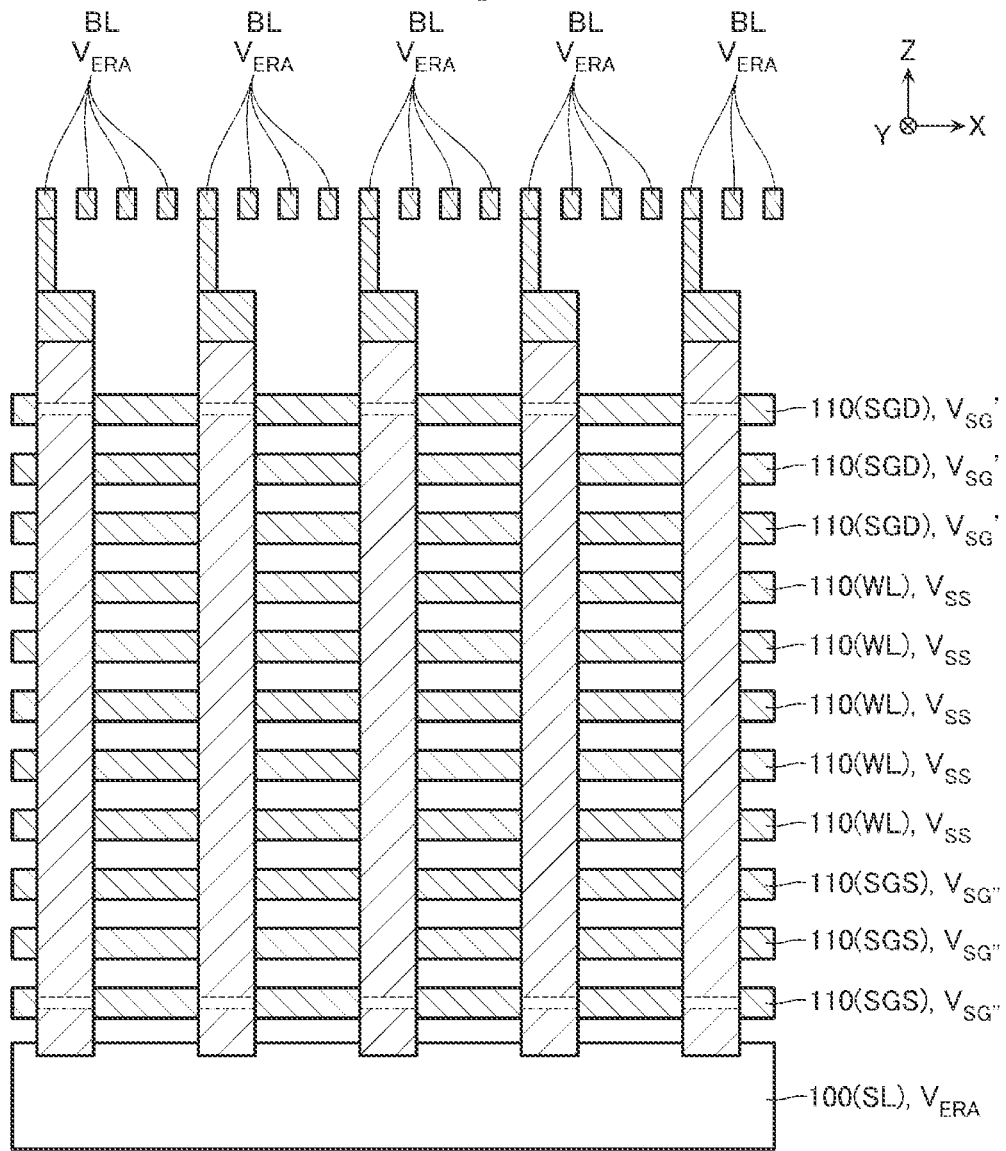
FIG. 11 is a cross-sectional view schematically illustrating an erasing operation.

Next, an erasing operation of the semiconductor storage device according to the present embodiment will be described. FIG. 11 is a cross-sectional view schematically illustrating the erasing operation.

In the following description, an example of performing an erasing operation on the memory block BLK as an operation target will be described.

In the erasing operation, the erasing voltage $V_{ERA}$ is supplied to the bit line BL and the source line SL. The erasing voltage $V_{ERA}$ may be higher than the program voltage $V_{PGM}$ or equal to the program voltage $V_{PGM}$, for example.

In the erasing operation, a voltage $V_{SG}'$ is supplied to the drain-side select gate line SGD. The voltage $V_{SG}'$ is lower than the erasing voltage $V_{ERA}$. Thus, gate induced drain leakage (GIDL) occurs in the drain-side select transistor STD, and electron-hole pairs are generated. The electrons move to the bit line BL side, and the holes move to the memory cell MC side.

In the erasing operation, a voltage $V_{SG}''$ is supplied to the source-side select gate lines SGS and SGSb. The voltage $V_{SG}''$ is lower than the erasing voltage $V_{ERA}$. Thus, GIDL occurs in the source-side select transistors STS and STSb, and electron-hole pairs are generated. The electrons move to the source line SL side, and the holes move to the memory cell MC side.

In the erasing operation, the ground voltage $V_{SS}$ is supplied to the word line WL. Thus, holes in the channel of the semiconductor pillar 120 tunnel into the charge storage film 132 (FIG. 8) via the tunnel insulating film 131 (FIG. 8). Thus, the threshold voltage of the memory cell MC decreases.

In the erasing operation, the transistor $T_{BL}$ described with reference to FIG. 4 turns into the OFF state. Thus, in the erasing operation, the sense amplifier module SAM is electrically disconnected from the bit line BL.

Method of Generating Program Voltage $V_{PGM}$

As described with reference to FIG. 10, in the semiconductor storage device according to the first embodiment, the program voltage $V_{PGM}$ is supplied to the selected word line $WL_S$. Here, the program voltage $V_{PGM}$ is a relatively high voltage among the voltages used in the semiconductor storage device. Therefore, there may be a concern about a breakdown voltage, a reliable lifetime, and the like of a configuration for controlling the program voltage $V_{PGM}$ in the peripheral circuit PC.

Thus, in the semiconductor storage device according to the first embodiment, the program voltage $V_{PGM}$ is generated by a method as follows, thereby an occurrence of the concern about the breakdown voltage, the reliable lifetime, and the like is reduced.

Figure 12:
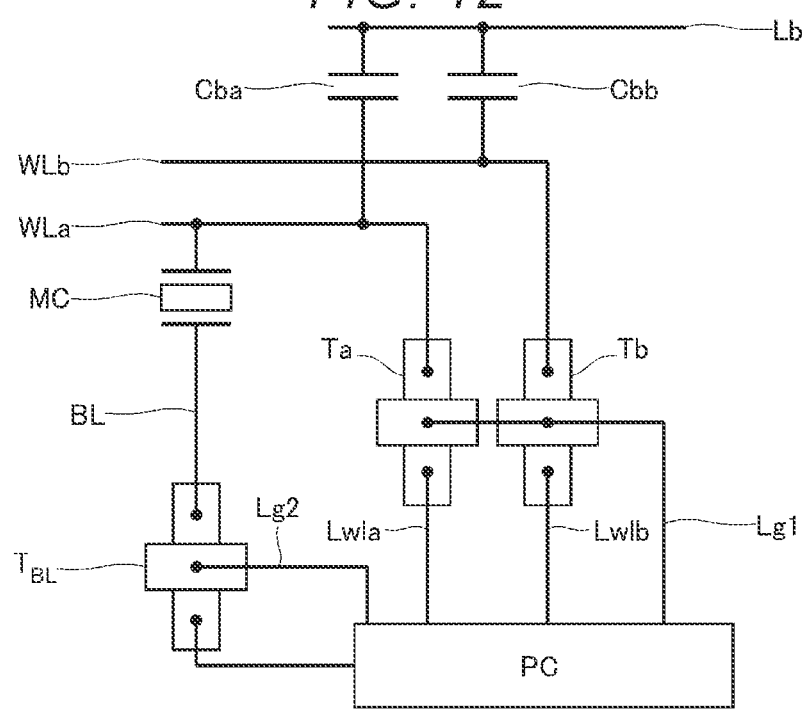
FIG. 12 is a schematic circuit diagram illustrating the write operation of the semiconductor storage device according to the present embodiment.
Figure 13:
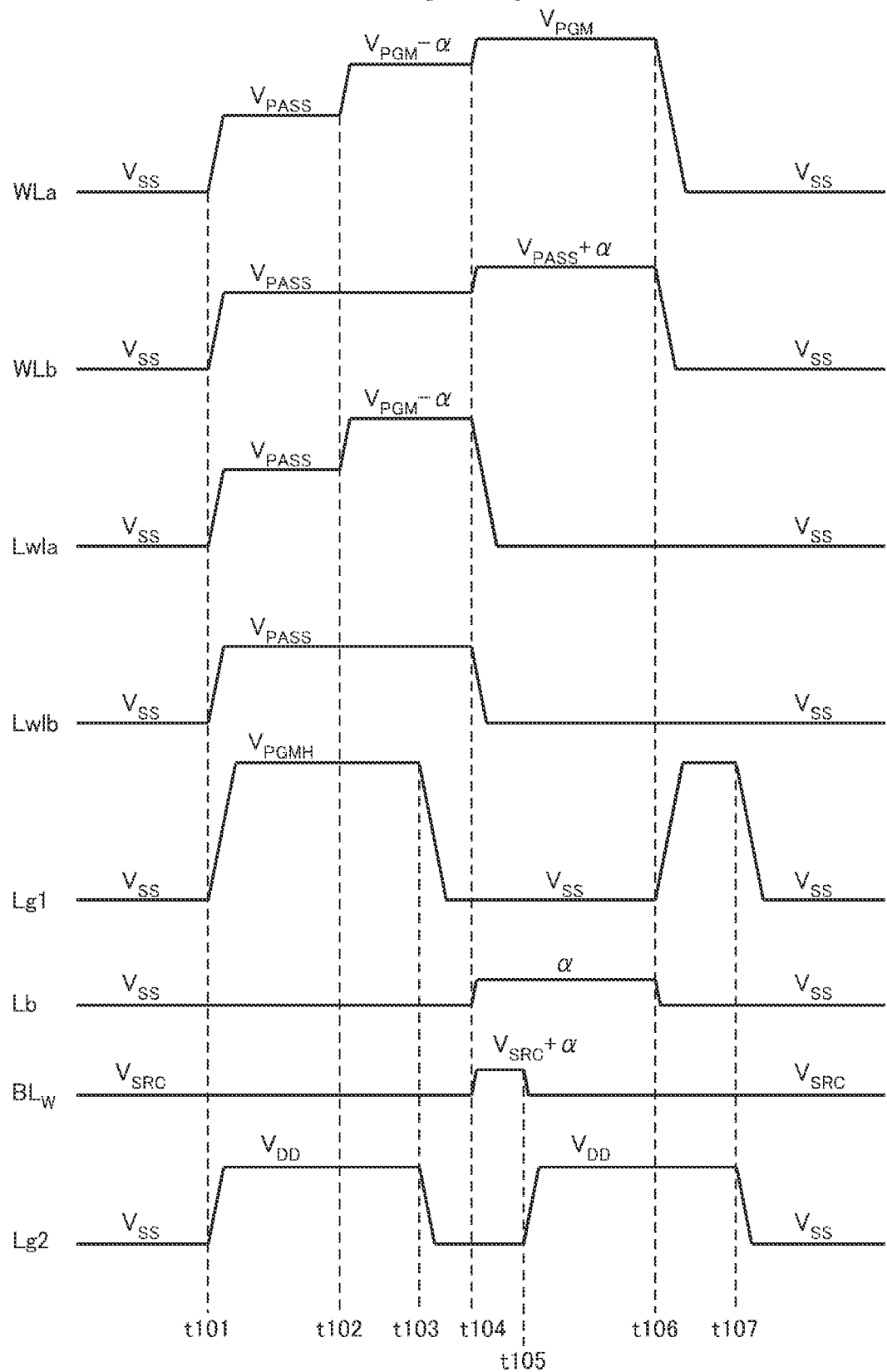
FIG. 13 is a schematic waveform diagram illustrating the write operation.

FIG. 12 is a schematic circuit diagram illustrating the write operation of the semiconductor storage device according to the present embodiment. FIG. 13 is a schematic waveform diagram illustrating the write operation.

FIG. 12 illustrates one memory cell MC. In addition, FIG. 12 illustrates a word line WLa connected to the memory cell MC and another word line WLb. The two word lines WLa and WLb are connected to other configurations in the peripheral circuit PC via transistors Ta and Tb and voltage supply lines Lwla and Lwlb, respectively. A common signal supply line Lg1 is connected to the gate electrodes of the transistors Ta and Tb. The memory cell MC is connected to the peripheral circuit PC via the bit line BL and the transistor $T_{BL}$. A signal supply line Lg2 is connected to the gate electrode of the transistor $T_{BL}$.

The transistors Ta and Tb may be, for example, the transistors $T_{BLK}$ described with reference to FIG. 3. The signal supply line Lg1 may be the signal supply line BLK-SEL described with reference to FIG. 3. The voltage supply lines Lwla and Lwlb may be, for example, the voltage supply line CG described with reference to FIG. 3. The signal supply line Lg2 may be the signal supply line BLS described with reference to FIG. 4.

As illustrated in FIG. 12, the semiconductor storage device according to the present embodiment includes capacitors Cba and Cbb connected to the word lines WLa and WLb, and a wiring Lb commonly connected to the capacitors Cba and Cbb.

As illustrated in FIG. 13, at a timing t101 in the write operation according to the present embodiment, the write pass voltage $V_{PASS}$ is supplied to the voltage supply lines Lwla and Lwlb, and a voltage $V_{PGMH}$ is supplied to the signal supply line Lg1. In addition, the ground voltage $V_{SS}$ is supplied to the wiring Lb, the voltage $V_{SRC}$ is supplied to the bit line $BL_W$, and the voltage $V_{DD}$ is supplied to the signal supply line Lg2. The voltage $V_{PGMH}$ is, for example, a voltage substantially equal to or higher than the sum of the voltage $V_{PGM}-\alpha$, which will be described later, and the threshold voltages of the transistors Ta and Tb. At the timing t101, the write pass voltage $V_{PASS}$ is transferred to the word lines WLa and WLb.

At a timing t102, the voltage $VP_{PGM}-\alpha$ is supplied to the voltage supply line Lwla. The voltage $V_{PGM}-\alpha$ is lower than the program voltage $V_{PGM}$. Thus, the voltage $V_{PGM}-\alpha$ is transferred to the word line WLa.

At a timing t103, the ground voltage $V_{SS}$ is supplied to the signal supply lines Lg1 and Lg2. Thus, the word lines WLa and WLb and the bit line BL are in a floating state. The voltage of the signal supply line Lg1 does not have to be the ground voltage $V_{SS}$ as long as the voltage causes the transistors Ta and Tb to be in the OFF state.

At a timing t104, the voltage of the wiring Lb increases from the ground voltage $V_{SS}$ to a voltage $\alpha$.

Here, as described with reference to FIG. 12, the capacitors Cba and Cbb are provided between the wiring Lb and the word lines WLa and WLb. Thus, when the voltage of the wiring Lb increases from the ground voltage $V_{SS}$ to the voltage $\alpha$, the voltages of the word lines WLa and WLb also increase by the voltage $\alpha$. As a result, the voltage of the word line WLa rises to the program voltage $V_{PGM}$. In the example illustrated in FIG. 13, the voltage of the word line WLb increases to a voltage $V_{PASS}+\alpha$ which is higher than the write pass voltage $V_{PASS}$.

When the voltages of the word line WLa and WLb increase by the voltage $\alpha$, the potential of the electron channel formed on the outer peripheral surface of the semiconductor pillar 120 also increases by about the voltage $\alpha$ due to the capacitive coupling between the word line WL and the semiconductor pillar 120. Thus, the voltage of the bit line BL also increases by about the voltage $\alpha$. In the example illustrated in FIG. 13, the voltage of the bit line BL increases to a voltage $V_{SRC}+\alpha$.

In the example illustrated in FIG. 13, the ground voltage $V_{SS}$ is supplied to the voltage supply lines Lwla and Lwlb at the timing t104.

At a timing t105, the voltage $V_{DD}$ is supplied to the signal supply line Lg2. Thus, the voltage $V_{SRC}$ is transferred to the bit line BL. As a result, the voltage as described with reference to FIG. 10 is supplied to each wiring.

At a timing t106, the voltage of the wiring Lb decreases from the voltage α to the ground voltage $V_{SS}$. The voltage $V_{PGMH}$ is supplied to the signal supply line Lg1. Thus, electric charges in the word lines WLa and WLb are discharged, and the voltages of the word lines WLa and WLb decrease to the ground voltage $V_{SS}$.

At a timing t107, the voltages of the signal supply lines Lg1 and Lg2 decrease to the ground voltage $V_{SS}$.

Here, for example, when the transistors Ta and Tb are the transistors $T_{BLK}$ described with reference to FIG. 3 and the voltage supply lines Lwla and Lwlb are the voltage supply line CG described with reference to FIG. 3, the maximum voltage in a current path from the output terminal of the voltage generation unit vg1 to the source terminal of the transistor $T_{BLK}$ during the write operation is a voltage $V_{PGM}$-α which is lower than the program voltage $V_{PGM}$.

According to such a method, since the voltage to be transferred is reduced, it is possible to reduce the occurrence of a concern about the breakdown voltages, the reliability lifetimes, and the like of the transistors $T_{WLS}$, $T_{WLU}$, $T_{DRV1}$, and $T_{DRV3}$ and the voltage generation unit vg1, which are provided in the current path. Further, it is possible to adopt a transistor having a smaller circuit area. In addition, it is possible to reduce the maximum voltage $V_{PGMH}$ supplied to the gate electrode of the transistor $T_{BLK}$ or the like. Thus, it is possible to reduce the generation of a leakage current between the transistors $T_{BLK}$.

Second Embodiment

Figure 14:
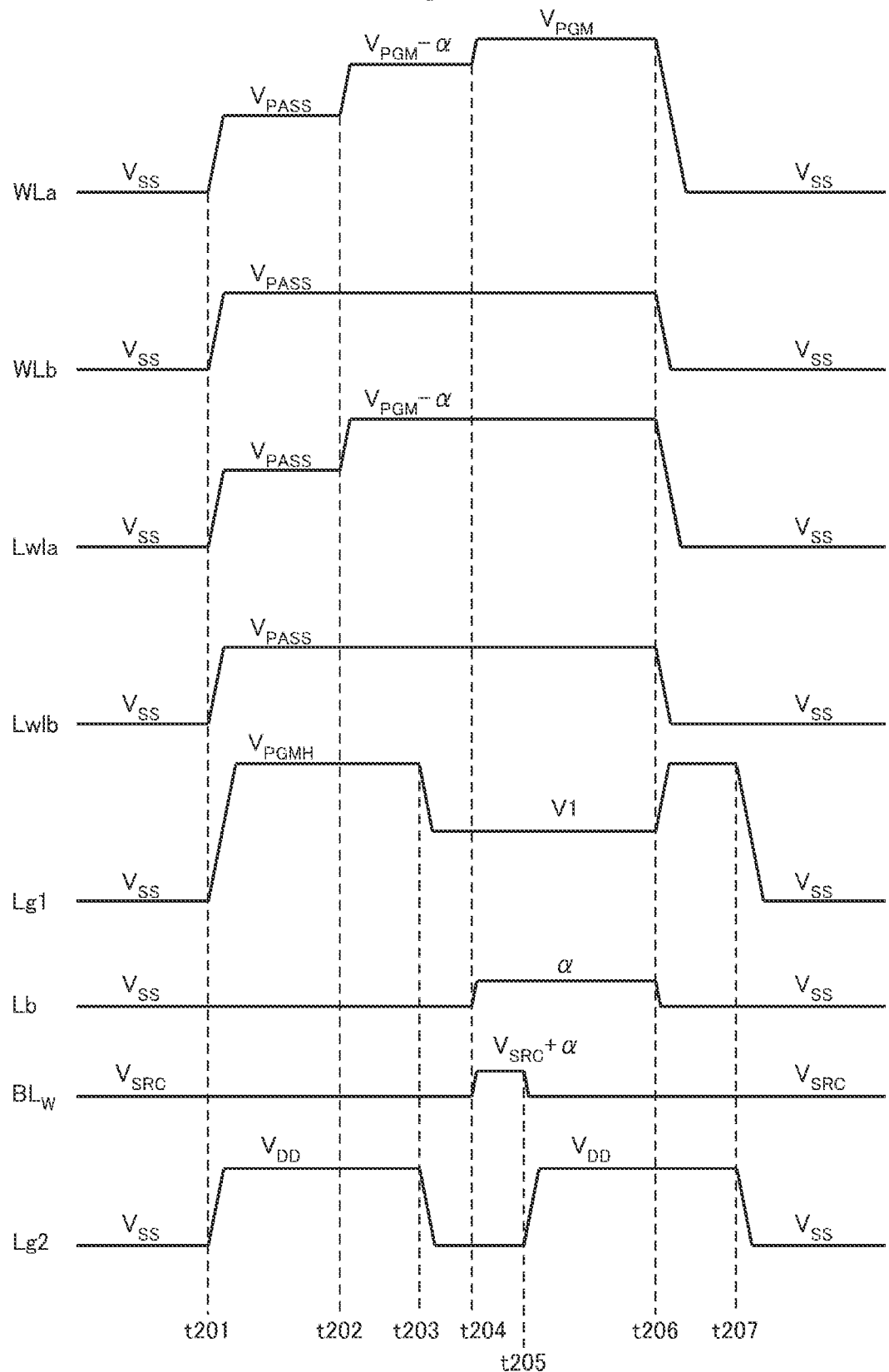
FIG. 14 is a schematic waveform diagram illustrating a write operation of a semiconductor storage device according to a second embodiment.

Next, a semiconductor storage device according to a second embodiment will be described with reference to FIG. 14. FIG. 14 is a schematic waveform diagram illustrating a write operation of the semiconductor storage device according to the present embodiment.

The semiconductor storage device according to the second embodiment is basically configured in the similar manner to the semiconductor storage device according to the first embodiment. However, a portion of the write operation in the semiconductor storage device according to the second embodiment is different from a portion of the write operation in the semiconductor storage device according to the first embodiment.

As illustrated in FIG. 14, the operations at timings t201 and t202 in a write operation according to the present embodiment are similar to the operations at the timings t101 and t102 in the write operation according to the first embodiment.

At a timing t203, a voltage V1 is supplied to the signal supply line Lg1 and the ground voltage $V_{SS}$ is supplied to the signal supply line Lg2. Here, the voltage V1 is higher than the write pass voltage $V_{PASS}$. The voltage difference between the voltage V1 and the write pass voltage $V_{PASS}$ is greater than the threshold voltage of the transistor Tb. Thus, the transistor Tb is maintained in the ON state. The voltage difference between the voltage V1 and the voltage $V_{PGM}$-α is smaller than the threshold voltage of the transistor Ta. Thus, the transistor Ta turns into the OFF state. As a result, the word line WLa is selectively in a floating state.

At a timing t204, the voltage of the wiring Lb increases from the ground voltage $V_{SS}$ to a voltage α. Here, the voltage of the word line WLa rises to the program voltage $V_{PGM}$ as in the first embodiment. The voltage of the word line WLb is maintained at the write pass voltage $V_{PASS}$. In the example illustrated in FIG. 14, the voltage of the voltage supply line Lwla is maintained at the voltage $V_{PGM}$-α at the timing t204. This is to maintain the transistor Ta in the OFF state.

The voltage of the voltage supply line Lwlb is maintained at the write pass voltage $V_{PASS}$. This is to maintain the transistor Tb in the ON state.

The operations at timings t205 to t207 are basically the same as the operations at the timings t105 to t107 in the write operation according to the first embodiment. At the timing t206, the ground voltage $V_{SS}$ is supplied to the voltage supply lines Lwla and Lwlb.

According to such a method, it is possible to maintain the voltage of the unselected word line $WL_U$ at the write pass voltage $V_{PASS}$.

Third Embodiment

Figure 15:
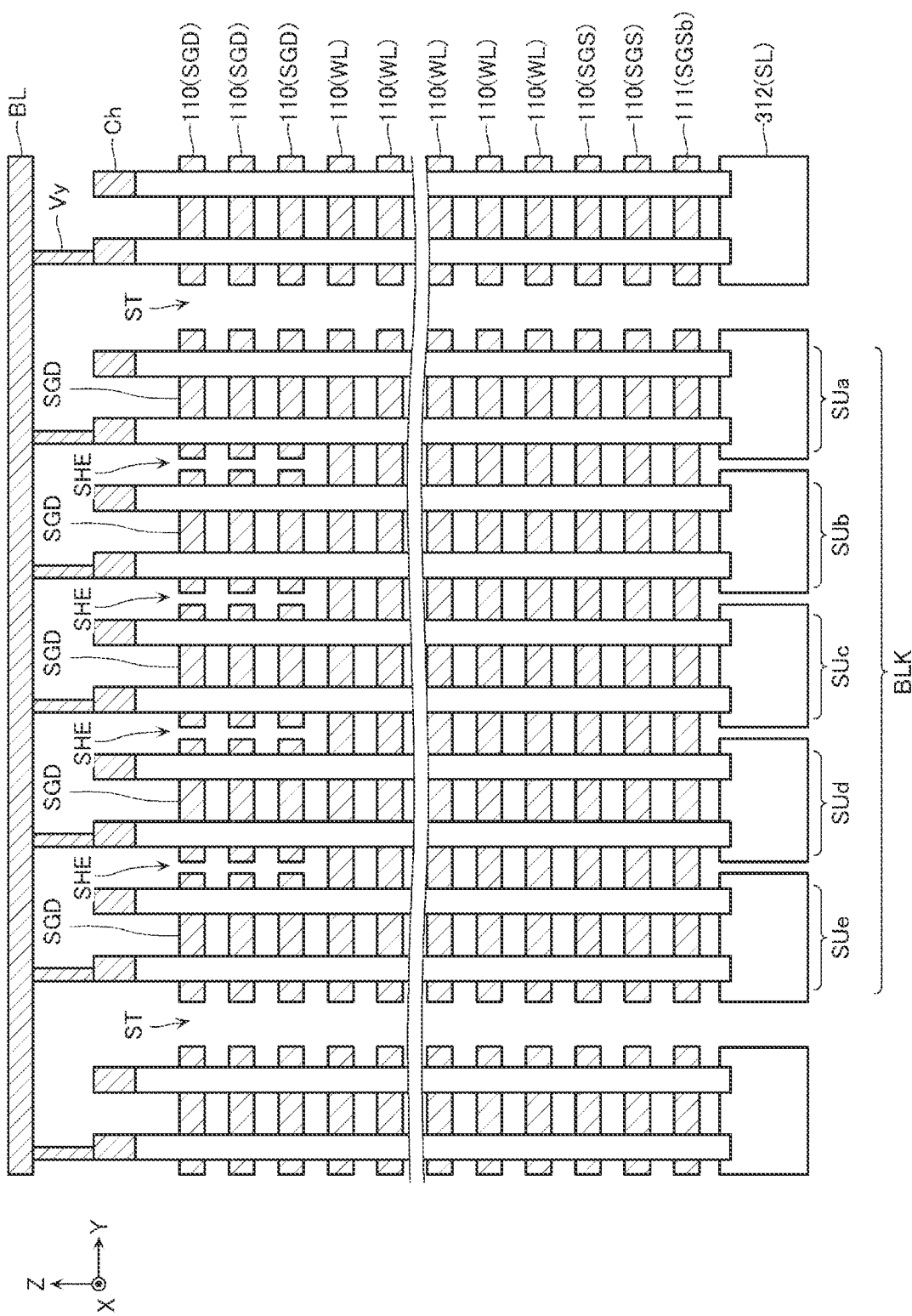
FIG. 15 is a cross-sectional view schematically illustrating a partial configuration of a semiconductor storage device according to a third embodiment.

Next, a semiconductor storage device according to a third embodiment will be described with reference to FIG. 15. FIG. 15 is a cross-sectional view schematically illustrating a write operation of the semiconductor storage device according to the present embodiment.

The semiconductor storage device according to the third embodiment is basically configured in the similar manner to the semiconductor storage device according to the first embodiment or the second embodiment. However, in the semiconductor storage device according to the third embodiment, the source line SL is electrically independent for each string unit SU. FIG. 15 illustrates a conductive layer 312 that functions as the source line SL. The conductive layer 312 is basically configured in the similar manner to the conductive layer 112. However, the conductive layer 312 is electrically independent for each string unit SU.

In the semiconductor storage device according to the third embodiment, in the write operation, a configuration in the string unit SU that does not include the selected page PG is used as the capacitors Cba and Cbb (FIG. 12). For example, when a string unit SUa includes the selected page PG, the semiconductor pillars 120 corresponding to string units SUb to SUe function as one electrodes of the capacitors Cba and Cbb. The plurality of conductive layers 110 function as the other electrodes of the capacitors Cba and Cbb. The conductive layer 312 (source line SL) corresponding to the string units SUb to SUe functions as the wiring Lb.

The write operation according to the third embodiment is basically performed in the similar manner to the write operation according to the first embodiment or the second embodiment. However, in the write operation of the semiconductor storage device according to the third embodiment, for example, the voltage of the conductive layer 312 corresponding to the string unit SUa is set to a voltage higher than the voltage of the conductive layer 312 corresponding to the string units SUb to SUe. The voltages of the source-side select gate lines SGS and SGSb are adjusted to have the magnitude at which the source-side select transistors STS and STSb corresponding to the string unit SUa turn into the OFF state, and the source-side select transistors STS and STSb corresponding to the string units SUb to SUe turn into the ON state. At the timing t104 in FIG. 13 or the timing t204 in FIG. 14, the voltage of the conductive layer 312 corresponding to the string units SUb to SUe is increased by the voltage α. Along with this increase, the potential of the channel formed on the outer peripheral surface of the semiconductor pillars 120 in the string units SUb to SUe increase by α. The voltage of the conductive layer 110 increases by α due to capacitive coupling between the semiconductor pillar 120 and the conductive layer 110.

When such a method is adopted, and the voltage of the conductive layer 312 corresponding to the string units SUb to SUe is about the voltage $V_{SRC}$, the threshold voltage of the memory cell MC in the string units SUb to SUe may fluctuate. Thus, it is desirable that the voltage of the conductive layer 312 corresponding to the string units SUb to SUe is higher than at least larger the voltage $V_{SRC}$.

Further, when such a method is adopted, and the voltage of the conductive layer 312 corresponding to the string units SUb to SUe is about the write pass voltage $V_{PASS}$, an electron channel may not be formed on the outer peripheral surface of the semiconductor pillar 120. Thus, it is desirable that the voltage of the conductive layer 312 corresponding to the string units SUb to SUe is lower than, for example, a voltage $V_{PASS}-V_{READ}$ which is substantially equal to the voltage difference between the write pass voltage $V_{PASS}$ and the read pass voltage $V_{READ}$.

Fourth Embodiment

Figure 16:
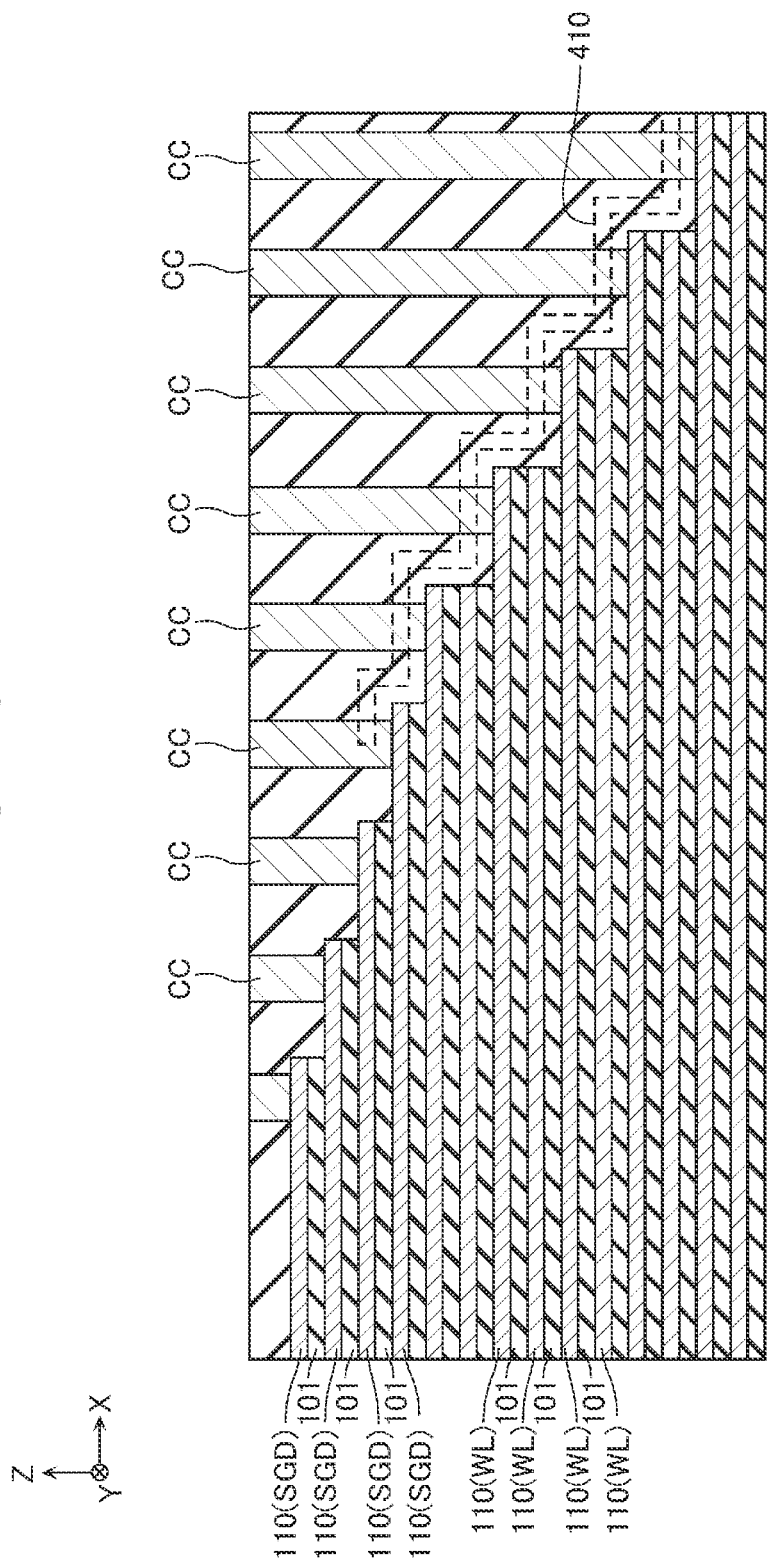
FIG. 16 is a cross-sectional view schematically illustrating a partial configuration of a semiconductor storage device according to a fourth embodiment.
Figure 17:
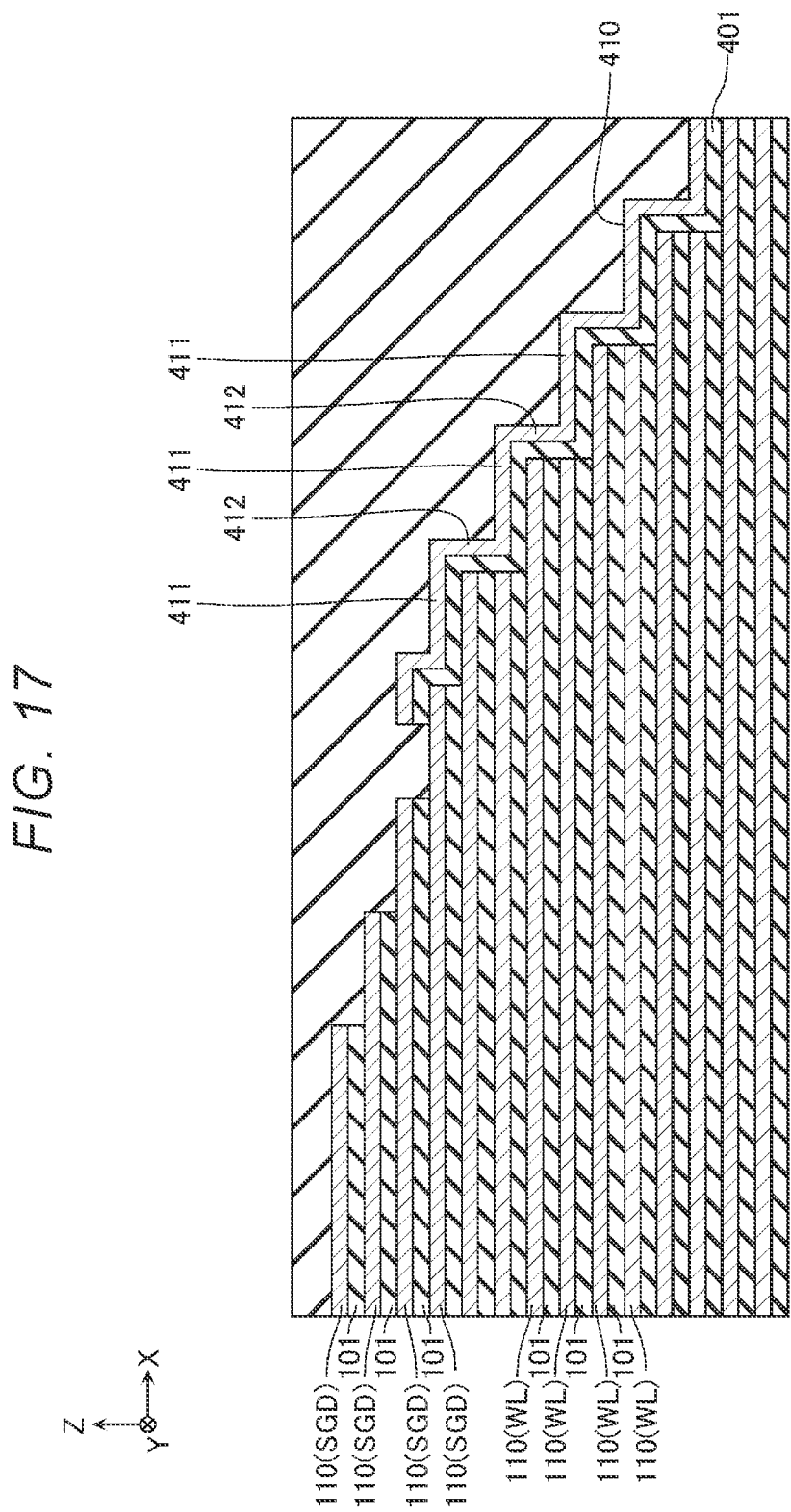
FIG. 17 is a cross-sectional view schematically illustrating a partial configuration of the semiconductor storage device according to the fourth embodiment.

Next, a semiconductor storage device according to a fourth embodiment will be described with reference to FIGS. 16 and 17. FIGS. 16 and 17 are cross-sectional views schematically illustrating a partial configuration of the semiconductor storage device according to the present embodiment. The Y-direction position corresponding to the XZ cross section in FIG. 16 is different from the Y-direction position corresponding to the XZ cross section in FIG. 17.

The semiconductor storage device according to the fourth embodiment is basically configured in the similar manner to the semiconductor storage device according to the first embodiment or the second embodiment. However, as illustrated in FIG. 17, the semiconductor storage device according to the fourth embodiment includes an insulating layer 401 and a conductive layer 410 that cover the end portions of a plurality of conductive layers 110 in the X direction. The conductive layer 410 functions as one electrodes of the capacitors Cba and Cbb and the wiring Lb described with reference to FIG. 12.

FIGS. 16 and 17 illustrate the end portions of the plurality of conductive layers 110 arranged in the Z direction, in the X direction. FIG. 16 illustrates a plurality of contact electrodes CC arranged in the X direction. FIG. 17 illustrates the conductive layer 410 and the insulating layer 401. For example, the conductive layer 410 may include a stacked film of a barrier conductive film made of titanium nitride (TiN) or the like and a metal film made of tungsten (W) or the like. The conductive layer 410 includes a plurality of facing regions 411 and a plurality of connection regions 412. The plurality of facing regions 411 extend in the X direction and respectively face the upper surfaces of the plurality of conductive layers 110 arranged in the Z direction. Each of the connection regions 412 extends in the Z direction and is connected to two facing regions having different height positions. The insulating layer 401 contains, for example, silicon oxide ($SiO_2$) and the like.

Fifth Embodiment

Next, a semiconductor storage device according to a fifth embodiment will be described.

In the first to fourth embodiments, the program voltage $V_{PGM}$ is generated by using capacitive coupling in a state where the word line WL is electrically disconnected from the peripheral circuit PC, and thus the occurrence of a concern about the breakdown voltage, the reliability lifetimes, and the like of the configuration in the peripheral circuit PC is reduced.

Such a method is merely an example. For example, when a negative voltage is supplied to the bit line BL in a write operation, it is possible to set the voltage supplied to the selected word line $WL_S$ in the write operation.

Figure 18:
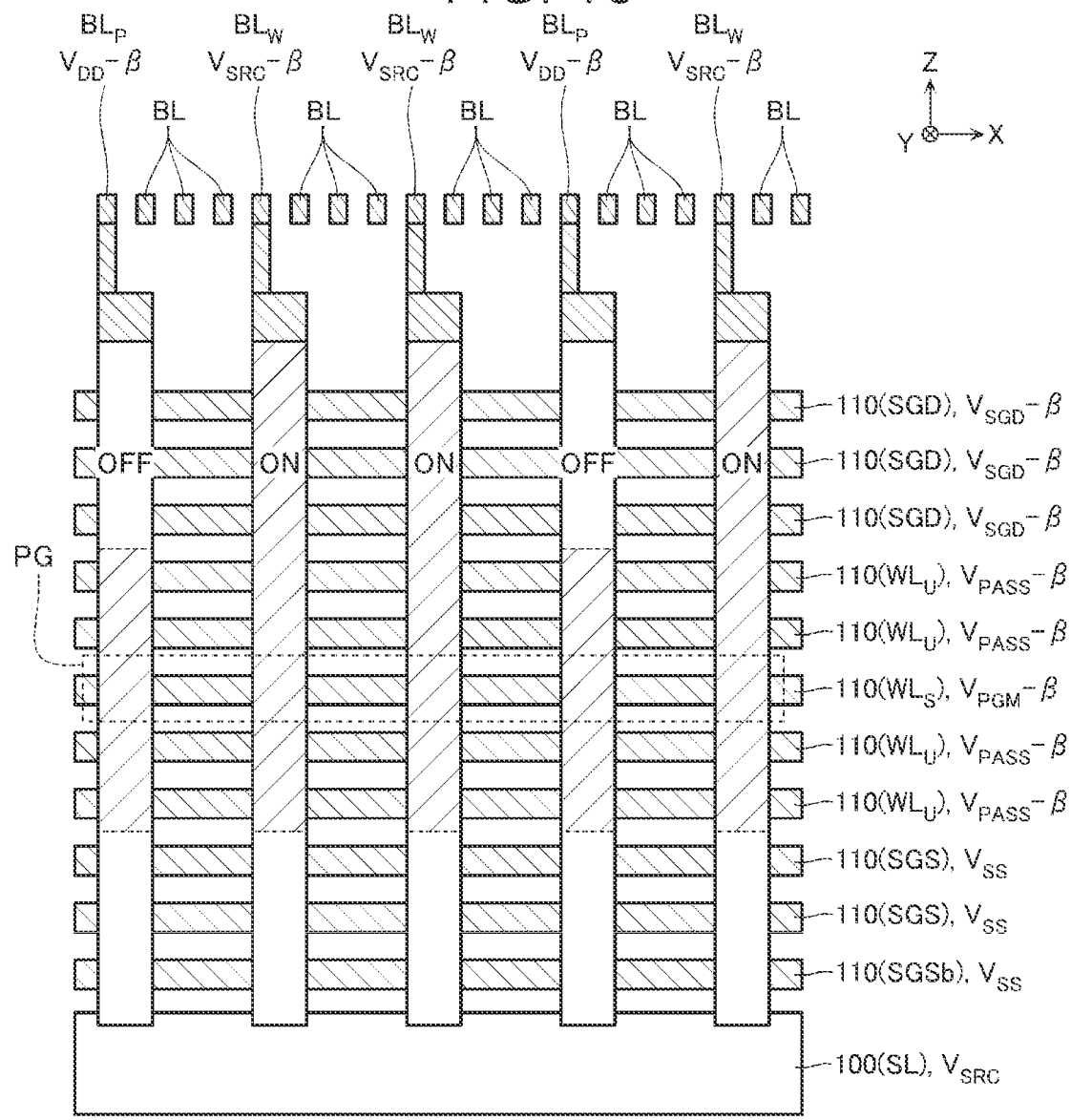
FIG. 18 is a cross-sectional view schematically illustrating a write operation of a semiconductor storage device according to a fifth embodiment.

FIG. 18 is a cross-sectional view schematically illustrating a write operation of the semiconductor storage device according to the fifth embodiment. The write operation according to the fifth embodiment is basically performed in the similar manner to the write operation described with reference to FIG. 10. However, in the write operation according to the fifth embodiment, as illustrated in FIG. 18, the voltages supplied to the bit line BL, the word line WL, and the drain-side select gate line SGD are lower than the respective voltages described with reference to FIG. 10, by a voltage $\beta$.

When the write operation is performed by such a method, for example, a negative voltage $V_{SRC}-\beta$ is supplied to the bit line $BL_W$. In such a case, it is desirable that a configuration capable of supplying a negative voltage is adopted as the transistor $T_{BL}$ described with reference to FIG. 4. This point will be described below.

Figure 19:
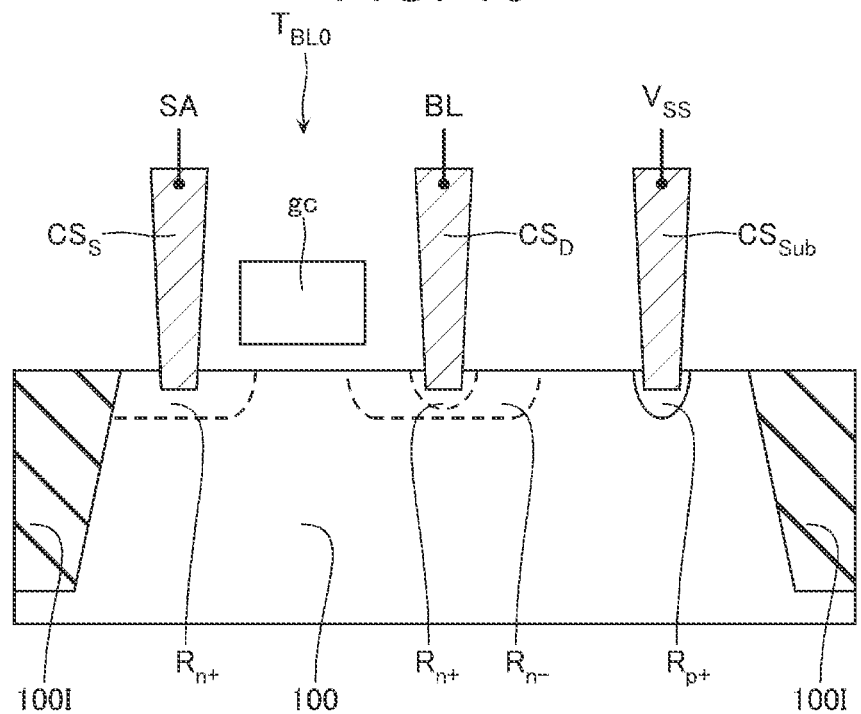
FIG. 19 is a cross-sectional view schematically illustrating a configuration of a transistor according to a first comparative example.

FIG. 19 is a cross-sectional view schematically illustrating a configuration of a transistor $T_{BL}$ according to a first comparative example. FIG. 19 illustrates a transistor $T_{BL0}$ as a configuration example of the transistor $T_{BL}$. The transistor $T_{BL0}$ is provided on a P-type semiconductor substrate 100. An impurity region $R_{n+}$ containing N-type impurities is provided at a contact portion of the semiconductor substrate 100 with a source electrode $CS_S$. An impurity region $R_{n+}$ containing N-type impurities is provided at a contact portion of the semiconductor substrate 100 with a drain electrode $CS_D$. A portion of the semiconductor substrate 100 functions as a channel region of the transistor $T_{BL0}$. A diffusion region $R_{n-}$ containing N-type impurities is provided between the channel region and the drain electrode $CS_D$. The semiconductor substrate 100 is provided with an electrode $CS_{Sub}$ that supplies a substrate voltage to the semiconductor substrate 100. The ground voltage $V_{SS}$ is supplied to the electrode $CS_{Sub}$.

In such a configuration, for example, when a negative voltage is supplied to the source electrode $CS_S$ of the transistor $T_{BL0}$, the electrode $CS_{Sub}$ and the source electrode $CS_S$ have a forward bias relation, and thus a large current may flow through the semiconductor substrate 100. Thus, the entirety of the device may be broken.

Figure 20:
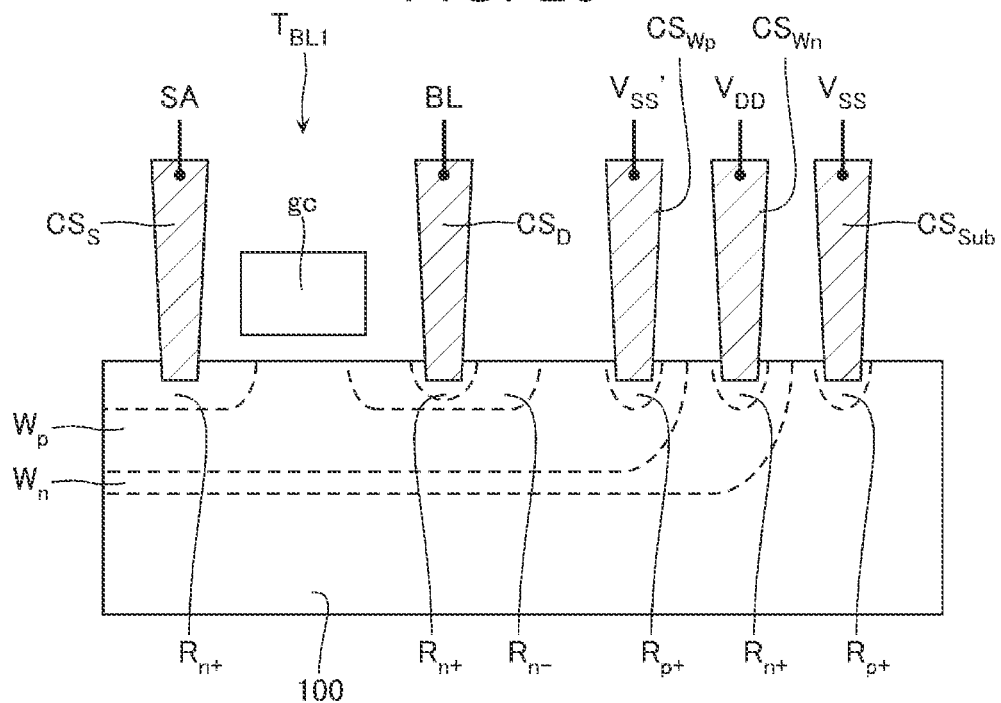
FIG. 20 is a cross-sectional view schematically illustrating a configuration of a transistor according to a second comparative example.

FIG. 20 is a cross-sectional view schematically illustrating a configuration of a transistor $T_{BL}$ according to a second comparative example. FIG. 20 illustrates a transistor $T_{BL1}$ as a configuration example of the transistor $T_{BL}$. In the example in FIG. 20, a P-type semiconductor substrate 100 is provided with an N-type well $W_n$ containing N-type impurities. The N-type well $W_n$ is provided with a P-type well $W_p$ containing P-type impurities. The transistor $T_{BL1}$ is basically configured in the similar manner to the transistor $T_{BL0}$. However, the transistor $T_{BL1}$ is provided in the P-type well $W_p$. In the example in FIG. 20, an electrode $CS_{Wn}$ is provided on the N-type well $W_n$. An electrode $CS_{Wp}$ is provided on the P-type well $W_p$. The voltage $V_{DD}$ is supplied to the electrode $CS_{Wn}$, and a voltage $V_{SS}'$ is supplied to the electrode $CS_{Wp}$.

In such a configuration, for example, when a negative voltage is supplied to the source electrode $CS_S$ of the transistor $T_{BL1}$, the voltage $V_{SS}'$ of the electrode $CS_{Wp}$ is also set to the negative voltage. Thus, it is possible to suitably transfer the negative voltage.

In such a configuration, it is necessary to provide the N-type well $W_n$ and the P-type well $W_p$ in the semiconductor substrate 100. Thus, the circuit area may increase.

In the present embodiment, a transistor capable of suitably transferring a negative voltage while preventing an increase in the circuit area is adopted as the transistor $T_{BL}$.

Figure 21:
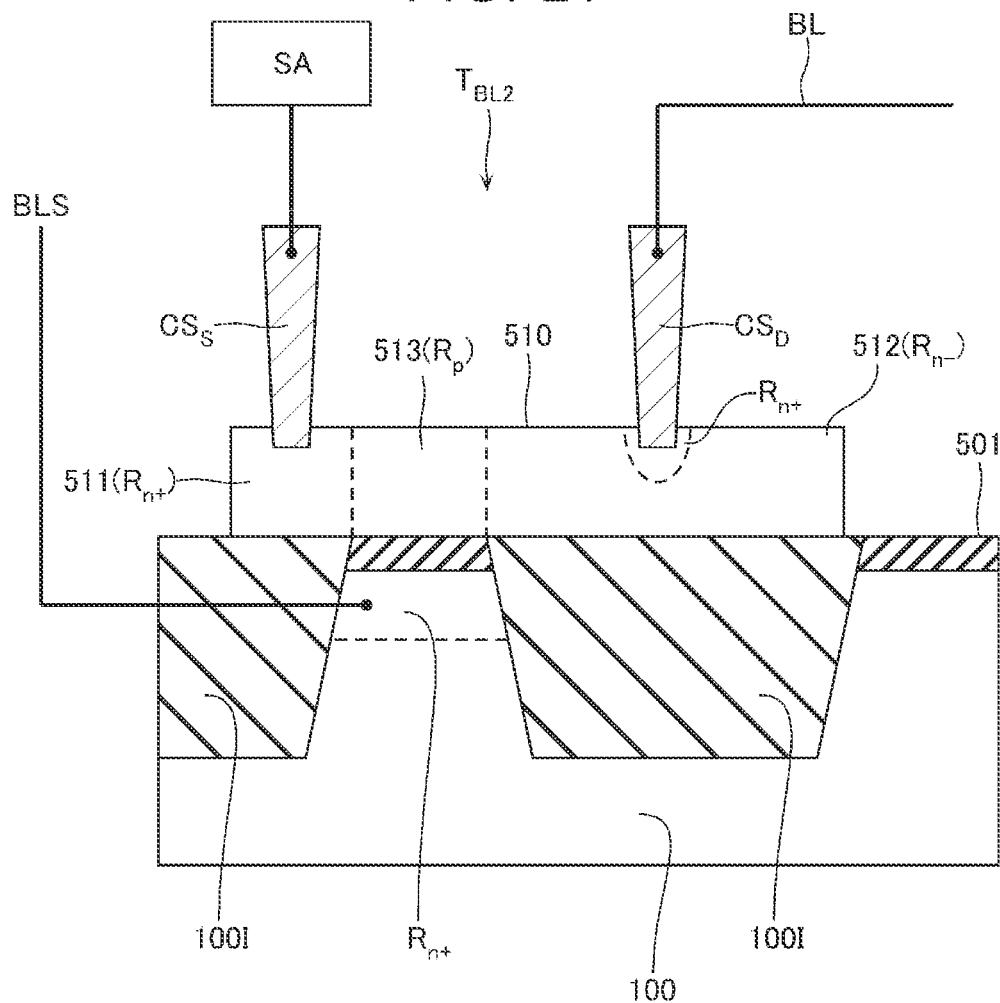
FIG. 21 is a cross-sectional view schematically illustrating a configuration of a transistor according to the fifth embodiment.

FIG. 21 is a cross-sectional view schematically illustrating a configuration of a transistor $T_{BL}$ according to the fifth embodiment. FIG. 21 illustrates a transistor $T_{BL2}$ as a configuration example of the transistor $T_{BL}$. That is, FIG. 21 illustrates a semiconductor substrate 100, a semiconductor layer 510 facing the upper surface of the semiconductor substrate 100, and a gate insulating film 501 that is made of silicon oxide ($SiO_2$) or the like and is provided between the semiconductor substrate 100 and the semiconductor layer 510.

In the example illustrated in FIG. 21, an impurity region $R_{n+}$ containing N-type impurities is provided on the upper surface of the semiconductor substrate 100. The impurity region $R_{n+}$ functions as a gate electrode of the transistor $T_{BL2}$. The impurity region $R_{n+}$ is connected to a contact electrode (not illustrated). The impurity region $R_{n+}$ is connected to the signal supply line BLS (FIG. 4) via the contact electrode.

The semiconductor layer 510 is a semiconductor layer made of polycrystalline silicon (Si), for example. The semiconductor layer 510 includes a source region 511, a drain region 512, and a gate region 513 provided between the source region 511 and the drain region 512.

The source region 511 is provided on the upper surface of the insulating region 100I. The upper surface of the source region 511 is connected to the source electrode $CS_S$. The source region 511 is provided with an impurity region $R_{n+}$ containing N-type impurities.

The drain region 512 is provided on the upper surface of the insulating region 100I. The upper surface of the drain region 512 is connected to the drain electrode $CS_D$. An impurity region $R_{n+}$ containing N-type impurities is provided at a contact portion of the drain region 512 with the drain electrode $CS_D$. A diffusion region $R_{n-}$ containing N-type impurities is provided in regions other than the drain region 512. The impurity concentration of the N-type impurities in the diffusion region $R_{n-}$ is smaller than the impurity concentration of the N-type impurities in the impurity region $R_{n+}$.

The gate region 513 is provided on the upper surface of the gate insulating film 501. The gate region 513 is provided with an impurity region $R_p$ containing P-type impurities. The lower surface of the gate region 513 faces the impurity region $R_{n+}$ of the semiconductor substrate 100 via the gate insulating film 501.

In such a configuration, for example, even though a negative voltage is supplied to the source electrode $CS_S$ of the transistor $T_{BL2}$, the current problem as described above does not occur. Thus, it is possible to suitably transfer the negative voltage.

In addition, in such a configuration, it is not necessary to provide the N-type well $W_n$ and the P-type well $W_p$ on the semiconductor substrate 100. Thus, it is possible to provide the transistor $T_{BL2}$ with a smaller circuit area than the transistor $T_{BL1}$ described with reference to FIG. 20.

Sixth Embodiment

Figure 22:
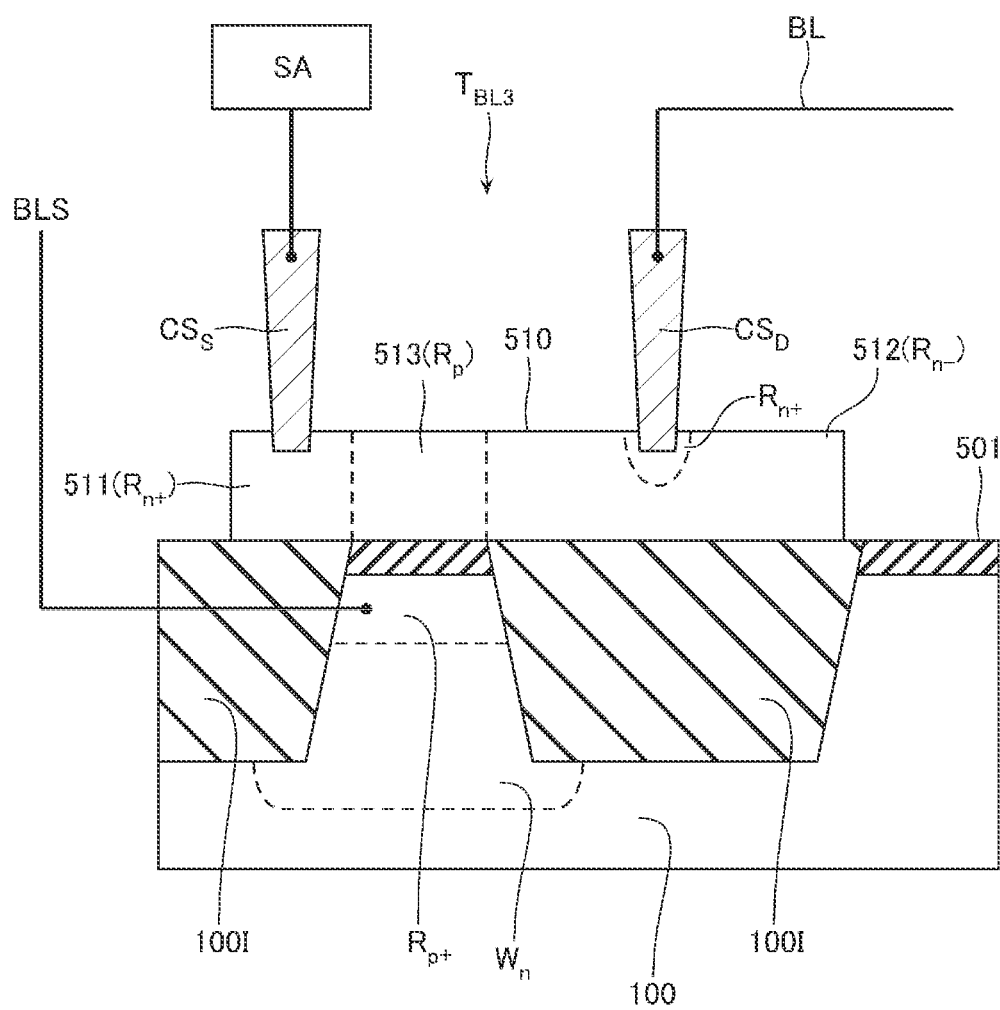
FIG. 22 is a cross-sectional view schematically illustrating a configuration of a transistor according to a sixth embodiment.

Next, a semiconductor storage device according to a sixth embodiment will be described with reference to FIG. 22. FIG. 22 is a cross-sectional view schematically illustrating a partial configuration of the semiconductor storage device according to the present embodiment.

The semiconductor storage device according to the sixth embodiment is basically configured in the similar manner to the semiconductor storage device according to the fifth embodiment. However, in the sixth embodiment, the semiconductor substrate 100 is provided with an N-type well $W_n$ containing N-type impurities. The semiconductor storage device according to the sixth embodiment includes a transistor $T_{BL3}$ instead of the transistor $T_{BL2}$.

The transistor $T_{BL3}$ is basically configured in the similar manner to the transistor $T_{BL2}$. However, in the sixth embodiment, an impurity region $R_{p+}$ containing P-type impurities is provided on the upper surface of the N-type well $W_n$, and the impurity region $R_{p+}$ functions as a gate electrode of the transistor $T_{BL3}$.

In the transistor $T_{BL3}$, both a positive voltage and a negative voltage may be used as the gate voltage of the transistor $T_{BL3}$.

Other Embodiments

Hitherto, the semiconductor storage device according to the first to sixth embodiments has been described. The above description is merely an example, and the specific configuration, the specific operation method, and the like may be adjusted as appropriate.

For example, the operation method as described with reference to FIGS. 13 and 14 is merely an example. In FIGS. 13 and 14, the magnitude of the voltage supplied to each wiring, the timing of supplying the voltage, and the like may be appropriately adjusted. For example, the voltage transferred to the voltage supply lines Lwla and Lwlb at the timing t101 in FIG. 13 may be a voltage $V_{PASS}-\alpha$ that is lower than the write pass voltage $V_{PASS}$ by the voltage $\alpha$.

The capacitors Cba and Cbb in FIG. 12 may be implemented by any configuration. For example, the capacitors Cba and Cbb may be implemented by the semiconductor substrate 100 (FIG. 6) and the electrode gc (FIG. 6). The capacitors Cba and Cbb may be implemented by capacitors using a configuration of the contact electrode CC or the like. As described with reference to FIG. 15, the capacitors Cba and Cbb may be implemented by the conductive layer 110 and the semiconductor pillar 120. As described with reference to FIG. 17, the capacitors Cba and Cbb may be implemented by the conductive layer 110 and the conductive layer 410. Further, the capacitors Cba and Cbb may be implemented by other configurations.

The semiconductor storage device according to the first to fourth embodiments may include, as the transistor $T_{BL}$ (FIG. 4), any one of the transistor $T_{BL0}$ (FIG. 19), the transistor $T_{BL1}$ (FIG. 20), the transistor $T_{BL2}$ (FIG. 21), and the transistor $T_{BL3}$ (FIG. 22). Further, in the semiconductor storage device according to the first to fourth embodiments, the transistor $T_{BL}$ (FIG. 4) may be omitted.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a first memory transistor;
   a first transistor electrically coupled to a gate electrode of the first memory transistor;
   a first voltage supply line electrically coupled to the gate electrode of the first memory transistor through the first transistor;
   a first signal supply line electrically coupled to a gate electrode of the first transistor;
   a first capacitor electrically coupled to the gate electrode of the first memory transistor without passing through the first transistor; and
   a first wiring coupled to a current path between the gate electrode of the first memory transistor and the first transistor through the first capacitor,
   wherein, in a write operation on the first memory transistor,
   at a first timing, a voltage present on the first voltage supply line is a first voltage, a voltage present on the first signal supply line is a second voltage, and a voltage present on the first wiring is a third voltage,
   at a second timing after the first timing, the voltage present on the first signal supply line decreases from the second voltage to a fourth voltage lower than the second voltage, and
   at a third timing after the second timing, the voltage present on the first wiring increases from the third voltage to a fifth voltage higher than the third voltage.

2. The semiconductor storage device according to claim 1, further comprising:
   a memory string including the first memory transistor and a second memory transistor;
   a second transistor electrically coupled to a gate electrode of the second memory transistor;
   a second voltage supply line electrically coupled to the gate electrode of the second memory transistor through the second transistor; and
   a second capacitor electrically coupled to the gate electrode of the second memory transistor without passing through the second transistor.

3. The semiconductor storage device according to claim 2, wherein
   a voltage present on the second voltage supply line maintains at a sixth voltage lower than the first voltage during a period from the first timing to the third timing in the write operation on the first memory transistor.

4. The semiconductor storage device according to claim 1, further comprising:
   a semiconductor substrate;
   a plurality of first conductive layers arranged in a first direction intersecting a surface of the semiconductor substrate;
   a first semiconductor pillar extending in the first direction and facing the plurality of first conductive layers; and
   a first charge storage film provided between the plurality of first conductive layers and the first semiconductor pillar,
   wherein the plurality of first conductive layers include a portion functioning as one electrode of the first capacitor.

5. The semiconductor storage device according to claim 4, further comprising:
   a second semiconductor pillar extending in the first direction and facing the plurality of first conductive layers; and
   a second charge storage film provided between the plurality of first conductive layers and the second semiconductor pillar,
   wherein the second semiconductor pillar includes a portion functioning as the other electrode of the first capacitor.

6. The semiconductor storage device according to claim 4, further comprising a first region and a second region arranged in a second direction intersecting the first direction, wherein
   the first region includes:
      the first semiconductor pillar; and
      the first charge storage film;
   the second region includes:
      a plurality of contact electrodes that extend in the first direction and are respectively coupled to the plurality of first conductive layers; and
      a second conductive layer facing the plurality of first conductive layers; and
   the second conductive layer includes a portion functioning as the other electrode of the first capacitor.

7. A control method of a semiconductor storage device including:
   providing a semiconductor storage device comprising: a first memory transistor; a first transistor electrically coupled to a gate electrode of the first memory transistor; a first voltage supply line electrically coupled to the gate electrode of the first memory transistor through the first transistor; a first signal supply line electrically coupled to a gate electrode of the first transistor; a first capacitor electrically coupled to the gate electrode of the first memory transistor without passing through the first transistor; and a first wiring coupled to a current path between the gate electrode of the first memory transistor and the first transistor via the first capacitor;
   when writing the first memory transistor, at a first timing, presenting a voltage on the first voltage supply line as a first voltage, a voltage on the first signal supply line as a second voltage, and a voltage on the first wiring as a third voltage, respectively;
   at a second timing after the first timing, decreasing the voltage on the first signal supply line from the second voltage to a fourth voltage lower than the second voltage; and
   at a third timing after the second timing, increasing the voltage on the first wiring from the third voltage to a fifth voltage higher than the third voltage.

8. The control method of a semiconductor storage device according to claim 7, wherein
   the semiconductor storage device further includes:
      a memory string including the first memory transistor and a second memory transistor;
      a second transistor electrically coupled to a gate electrode of the second memory transistor;
      a second voltage supply line electrically coupled to the gate electrode of the second memory transistor through the second transistor; and
      a second capacitor electrically coupled to the gate electrode of the second memory transistor without passing through the second transistor.

9. The control method of a semiconductor storage device according to claim 8, further comprising:
   maintaining a voltage on the second voltage supply line at a sixth voltage lower than the first voltage during a period from the first timing to the third timing in the write operation on the first memory transistor.

10. The control method of a semiconductor storage device according to claim 7, wherein
the semiconductor storage device further includes
a semiconductor substrate;
a plurality of first conductive layers arranged in a first direction intersecting a surface of the semiconductor substrate;
a first semiconductor pillar extending in the first direction and facing the plurality of first conductive layers; and
a first charge storage film provided between the plurality of first conductive layers and the first semiconductor pillar, and wherein
the plurality of first conductive layers include a portion functioning as one electrode of the first capacitor.

11. The control method of a semiconductor storage device according to claim 10, wherein
the semiconductor storage device further includes
a second semiconductor pillar extending in the first direction and facing the plurality of first conductive layers, and
a second charge storage film provided between the plurality of first conductive layers and the second semiconductor pillar, and
the second semiconductor pillar includes a portion functioning as the other electrode of the first capacitor.

12. The control method of a semiconductor storage device according to claim 10, wherein the semiconductor storage device includes a first region and a second region arranged in a second direction intersecting the first direction, wherein
the first region includes:
the first semiconductor pillar; and
the first charge storage film;
the second region includes:
a plurality of contact electrodes that extend in the first direction and are respectively coupled to the plurality of first conductive layers; and
a second conductive layer facing the plurality of first conductive layers, and wherein
the second conductive layer includes a portion functioning as the other electrode of the first capacitor.

13. A semiconductor storage device comprising:
a first memory transistor;
a bit line electrically coupled to the first memory transistor;
a third transistor electrically coupled to the first memory transistor via the bit line; and
a third signal supply line coupled to a gate electrode of the third transistor,
wherein the third transistor includes:
a first semiconductor layer facing a semiconductor substrate; and
a first insulating layer provided between the semiconductor substrate and the first semiconductor layer, and wherein the first semiconductor layer includes: a third region connected to a first electrode and containing impurities of a first conductive type; a fourth region connected to a second electrode and containing the impurities of the first conductive type; and a fifth region provided between the third region and the fourth region, and containing impurities of a second conductive type different from the first conductive type, and the semiconductor substrate includes an impurity region that faces the fifth region and is connected to the third signal supply line.

14. The semiconductor storage device according to claim 13, wherein
the third region contains N-type impurities,
the fourth region contains P-type impurities, and
the fifth region contains N-type impurities.

15. The semiconductor storage device according to claim 13, wherein
a negative voltage is supplied to the first electrode in a write operation on the first memory transistor.

* * * * *